United States Patent
Oh et al.

(10) Patent No.: US 11,126,216 B2
(45) Date of Patent: Sep. 21, 2021

(54) SIGNAL GENERATION CIRCUIT SYNCHRONIZED WITH A CLOCK SIGNAL AND A SEMICONDUCTOR APPARATUS USING THE SAME

(71) Applicant: SK hynix Inc., Icheon-si (KR)

(72) Inventors: Seung Wook Oh, Icheon-si (KR);
Young Hoon Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/006,309

(22) Filed: Aug. 28, 2020

(65) Prior Publication Data

US 2020/0393868 A1      Dec. 17, 2020

Related U.S. Application Data

(63) Continuation-in-part of application No. 16/736,688, filed on Jan. 7, 2020, now Pat. No. 10,886,927.

(30) Foreign Application Priority Data

Jan. 15, 2019 (KR) .................. 10-2019-0005213

(51) Int. Cl.
*G06F 1/10* (2006.01)
*H03K 5/01* (2006.01)
*H03K 3/017* (2006.01)
*H03K 19/20* (2006.01)

(52) U.S. Cl.
CPC ............... *G06F 1/10* (2013.01); *H03K 3/017* (2013.01); *H03K 5/01* (2013.01); *H03K 19/20* (2013.01)

(58) Field of Classification Search
CPC ...... G06F 1/04; G06F 1/06; G06F 1/08; G06F 1/10; G06F 1/12; H03L 7/0812; H03K 19/20
USPC .................................................. 327/108–115
See application file for complete search history.

(56) References Cited

U.S. PATENT DOCUMENTS

| | | | |
|---|---|---|---|
| 5,452,436 A * | 9/1995 | Arai | G06F 1/10 713/375 |
| 7,031,615 B2 | 4/2006 | Gentile | |
| 7,671,622 B2 * | 3/2010 | Oh | H03K 19/0005 326/30 |

(Continued)

FOREIGN PATENT DOCUMENTS

| KR | 1020150106092 A | 9/2015 |
|---|---|---|
| KR | 1020170137451 A | 12/2017 |

*Primary Examiner* — Tomi Skibinski
(74) *Attorney, Agent, or Firm* — William Park & Associates Ltd.

(57) ABSTRACT

A signal driver includes a first driver, a second driver, an on-timing control circuit, and an off-timing control circuit. The first driver is configured to generate a first driving pulse signal by inverting and driving an input pulse signal. The second driver is configured to generate a second driving pulse signal by inverting and driving the first driving pulse signal. The on-timing control circuit is configured to pull-up drive or pull-down drive the first driving pulse signal based on a first on-timing control signal, a second on-timing control signal, and the input pulse signal. The off-timing control circuit is configured to pull-up drive or pull-down drive the second driving pulse signal based on a first off-timing control signal, a second off-timing control signal, and the first driving pulse signal.

15 Claims, 20 Drawing Sheets

(56) References Cited

U.S. PATENT DOCUMENTS

| | | | |
|---|---|---|---|
| 8,638,110 B2* | 1/2014 | Lee | G01D 5/24 |
| | | | 324/679 |
| 2008/0101524 A1* | 5/2008 | Jeong | H03D 13/004 |
| | | | 375/376 |
| 2009/0267640 A1* | 10/2009 | Kuzmenka | H04L 25/0288 |
| | | | 326/30 |
| 2011/0148480 A1* | 6/2011 | Fan | G06F 1/04 |
| | | | 327/115 |
| 2011/0193598 A1* | 8/2011 | Bhakta | H03K 3/2885 |
| | | | 327/141 |
| 2011/0267112 A1* | 11/2011 | Lee | H03K 19/018528 |
| | | | 327/108 |
| 2015/0222283 A1* | 8/2015 | Wanibuchi | G06F 1/08 |
| | | | 327/115 |
| 2019/0052123 A1* | 2/2019 | Dina | G06F 1/04 |
| 2019/0333553 A1* | 10/2019 | Choi | G11C 7/222 |

* cited by examiner

FIG.12

| BYPASS | MODE | OSE | OSD | Retimer type |
|---|---|---|---|---|
| 0 | 0 | 2 | 1 | AND type |
| 0 | 1 | 1 | 2 | OR type |
| 1 | Don't care | 2 | 2 | Flip-flop type |
| 1 | | | | |

SIGNAL GENERATION CIRCUIT SYNCHRONIZED WITH A CLOCK SIGNAL AND A SEMICONDUCTOR APPARATUS USING THE SAME

CROSS-REFERENCE TO RELATED APPLICATIONS

This application is a continuation-in-part under 35 U.S.C. § 120 of application Ser. No. 16/736,688, filed on Jan. 7, 2020, titled "SIGNAL GENERATION CIRCUIT SYNCHRONIZED WITH A CLOCK SIGNAL AND A SEMICONDUCTOR APPARATUS USING THE SAME," for which a claim of priority was made under 35 U.S.C. § 119(a) to Korean application number 10-2019-0005213, filed on Jan. 15, 2019, in the Korean Intellectual Property Office.

BACKGROUND

1. Technical Field

Various embodiments generally relate to integrated circuit technology, and more particularly, to a semiconductor apparatus operating in synchronization with a clock signal.

2. Related Art

An electronic device includes many electronic components. A computer system, for example, may include many semiconductor apparatuses configured with semiconductors. The semiconductor apparatuses configuring the computer system may communicate with each other by transmitting and receiving clock signals and data. The semiconductor apparatuses may operate in synchronization with a clock signal. The semiconductor apparatuses may internally generate various signals based on a signal transmitted by an external apparatus. The various signals may be delayed and generated by internal circuits of the semiconductor apparatuses. The delays may include synchronous delays and asynchronous delays. For example, a memory apparatus, such as a dynamic random access memory (DRAM), may generate an internal signal using a synchronous delay with respect to data and clock signals related to the data, and may generate an internal signal using an asynchronous delay with respect to control signals, such as a command signal and an address signal, other than data. However, when data is output, the semiconductor apparatuses need to perform an operation of synchronizing an internal signal, generated using an asynchronous delay, with a clock signal again. Such an operation may be referred to as "domain crossing." As the operating speed of a computer system or semiconductor system increases, the frequency of a clock signal continues to increase. In order to secure a margin necessary to internally process a signal, semiconductor apparatuses generate and use a division clock signal having a low frequency by dividing a clock signal having the high frequency. When a domain crossing operation is performed using a division clock signal, there is a need for a circuit capable of generating a signal having a given delay quantity and a pulse width.

SUMMARY

In an embodiment, a signal driver may include a first driver configured to generate a first driving pulse signal by inverting and driving an input pulse signal. The signal driver may also include a second driver configured to generate a second driving pulse signal by inverting and driving the first driving pulse signal. The signal driver may further include an on-timing control circuit configured to pull-up drive or pull-down drive the first driving pulse signal based on a first on-timing control signal, a second on-timing control signal, and the input pulse signal. The signal driver may additionally include an off-timing control circuit configured to pull-up drive or pull-down drive the second driving pulse signal based on a first off-timing control signal, a second off-timing control signal, and the first driving pulse signal.

In an embodiment, a signal driver may include a first driver configured to generate a first driving pulse signal by inverting and driving an input pulse signal. The signal driver may also include a second driver configured to generate a second driving pulse signal by inverting and driving the first driving pulse signal. The signal driver may further include an on-timing control circuit configured to pull-up drive or pull-down drive the first driving pulse signal based on a logic level of the input pulse signal when an on-timing enable signal is enabled. The signal driver may additionally include an off-timing control circuit configured to pull-up drive or pull-down drive the second driving pulse signal based on the logic level of the input pulse signal and the first driving pulse signal when an off-timing enable signal is enabled.

In an embodiment, a signal driver may include a first driver configured to generate a first driving pulse signal by inverting and driving an input pulse signal. The signal driver may also include a second driver configured to generate a second driving pulse signal by inverting and driving the first driving pulse signal. The signal driver may further include an on-timing control circuit configured to control enabling timing of the first driving pulse signal based on a logic value of a first resistance code, a logic value of a second resistance code, an on-timing enable signal, and the input pulse signal. The signal driver may additionally include an off-timing control circuit configured to control disabling timing of the second driving pulse signal based on a logic value of the first resistance code, a logic value of the second resistance code, an off-timing enable signal, and the first driving pulse signal.

BRIEF DESCRIPTION OF THE DRAWINGS

FIG. 12 is a table illustrating retiming latency of the programmable retiming module set in response to a mode signal and a bypass signal.

DETAILED DESCRIPTION

Hereinafter, a signal generation circuit and a semiconductor apparatus is described with reference to the accompanying drawings through various embodiments.

Figure 1:
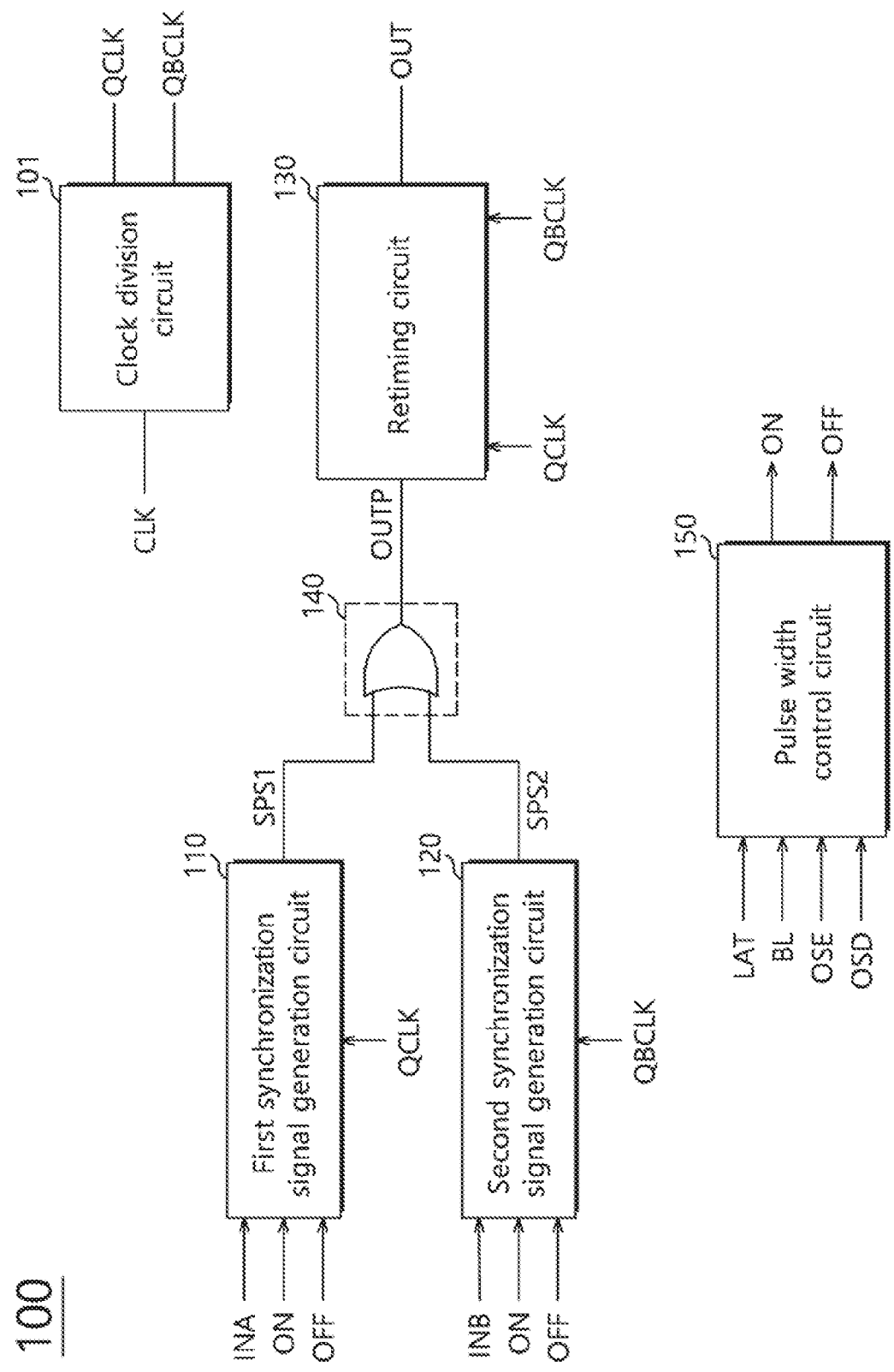
FIG. 1 is a diagram illustrating a configuration of a signal generation circuit according to various embodiments.

FIG. 1 is a diagram illustrating a configuration of a signal generation circuit 100 according to various embodiments. In FIG. 1, the signal generation circuit 100 may receive a first input signal INA and a second input signal INB and generate an output signal OUT. The signal generation circuit 100 may generate the output signal OUT by delaying the first input signal INA in synchronization with a first division clock signal QCLK and delaying the second input signal INB in synchronization with a second division clock signal QBCLK. The first division clock signal QCLK may have a phase different from that of the second division clock signal QBCLK. For example, the first division clock signal QCLK and the second division clock signal QBCLK may have a phase difference of 180 degrees. The signal generation circuit 100 may adjust a delay quantity of each of the first and second input signals INA and INB based on an on-control signal ON and an off-control signal OFF, and may adjust the pulse width of the output signal OUT.

The signal generation circuit 100 may include a clock division circuit 101. The clock division circuit 101 may generate the first and second division clock signals QCLK and QBCLK by dividing the frequency of a clock signal CLK. For example, the clock division circuit 101 may generate the first and second division clock signals QCLK and QBCLK by dividing the frequency of the clock signal CLK into two. The first division clock signal QCLK and the second division clock signal QBCLK may have a phase difference of 180 degrees. For example, the first division clock signal QCLK may have a phase synchronized with an odd-numbered falling edge of the clock signal CLK. The second division clock signal QBCLK may have a phase synchronized with an even-numbered falling edge of the clock signal CLK. The first input signal INA may be generated from a signal received in synchronization with an odd-numbered rising edge of the clock signal CLK. The second input signal INB may be generated from a signal received in synchronization with an even-numbered rising edge of the clock signal CLK. As the operating speeds of a semiconductor apparatus and system increase, the clock signal CLK may have a higher frequency. When the frequency of the clock signal CLK increases, a time margin for sampling or holding a signal may be insufficient because a cycle is shortened and amplitude is reduced. Accordingly, the signal generation circuit 100 can sufficiently secure a time margin for generating the output signal OUT from the first and second input signals INA and INB by generating the first and second division clock signals QCLK and QBCLK from the clock signal CLK and generating the output signal OUT using the first and second division clock signals QCLK and QBCLK.

The signal generation circuit 100 may include a first synchronization signal generation circuit 110, a second synchronization signal generation circuit 120, and a retiming circuit 130. The first synchronization signal generation circuit 110 may receive the first input signal INA, the first division clock signal QCLK, the on-control signal ON, and the off-control signal OFF, and may generate a first synchronization signal SPS1. The first synchronization signal generation circuit 110 may generate the first synchronization signal SPS1 by delaying the first input signal INA in synchronization with the first division clock signal QCLK, and may adjust the pulse width of the first synchronization signal SPS1 based on the on-control signal ON and the off-control signal OFF.

The first synchronization signal generation circuit 110 may generate an even on-pulse signal ONA (refer to FIG. 2) by delaying the first input signal INA by n cycles of the first division clock signal QCLK. In an embodiment, n represents a natural number. The first synchronization signal generation circuit 110 may determine enabling timing of the first synchronization signal SPS1 based on the even on-pulse signal ONA. The n may be determined based on the on-control signal ON. The n may be a value corresponding to information of the on-control signal ON. The first synchronization signal generation circuit 110 may generate an even off-pulse signal OFFA (refer to FIG. 2) by delaying the even on-pulse signal ONA by m cycles of the first division clock signal. In an embodiment, m represents a natural number. The first synchronization signal generation circuit 110 may determine disabling timing of the first synchronization signal SPS1 based on the even off-pulse signal OFFA. The m may be determined based on the off-control signal OFF. The m may be a value corresponding to information of the off-control signal OFF.

The second synchronization signal generation circuit 120 may receive the second input signal INB, the second division clock signal QBCLK, the on-control signal ON, and the off-control signal OFF, and may generate a second synchronization signal SPS2. The second synchronization signal generation circuit 120 may generate the second synchronization signal SPS2 by delaying the second input signal INB in synchronization with the second division clock signal QBCLK, and may adjust the pulse width of the second synchronization signal SPS2 based on the on-control signal ON and the off-control signal OFF.

The second synchronization signal generation circuit 120 may generate an odd on-pulse signal ONB (refer to FIG. 2) by delaying the second input signal INB by n cycles of the second division clock signal QBCLK. The second synchronization signal generation circuit 120 may determine enabling timing of the second synchronization signal SPS2 based on the odd on-pulse signal ONB. The second synchronization signal generation circuit 120 may generate an odd off-pulse signal OFFB (refer to FIG. 2) by delaying the odd on-pulse signal ONB by m cycles of the second division clock signal QBCLK. The second synchronization signal generation circuit 120 may determine disabling timing of the second synchronization signal SPS2 based on the odd off-pulse signal OFFB.

The retiming circuit 130 may receive a preliminary output signal OUTP generated from one of the first and second synchronization signals SPS1 and SPS2. The signal generation circuit 100 may further include a gating circuit 140 for receiving the first and second synchronization signals SPS1 and SPS2 and generating the preliminary output signal OUTP. The gating circuit 140 may output the first synchronization signal SPS1 or the second synchronization signal SPS2 as the preliminary output signal OUTP. For example, the gating circuit 140 may include an OR gate. The retiming circuit 130 may receive the first and second division clock signals QCLK and QBCLK. The retiming circuit 130 may generate the output signal OUT by retiming the preliminary output signal OUTP based on the first and second division clock signals QCLK and QBCLK. The retiming circuit 130 may generate the output signal OUT by delaying the preliminary output signal OUTP in synchronization with each of the first and second division clock signals QCLK and QBCLK and combining the delayed signals.

The signal generation circuit 100 uses clock signals having two different phases. Accordingly, the retiming circuit 130 cannot perform a retiming operation using only any one of the first and second division clock signals QCLK and QBCLK. For example, if the retiming circuit 130 retimes the preliminary output signal OUTP, generated from the first synchronization signal SPS1, based on the second division clock signal QBCLK or retimes the preliminary output signal OUTP, generated from the second synchronization signal SPS2, based on the first division clock signal QCLK, it is difficult to guarantee a given pulse width of the output signal OUT. The retiming circuit 130 can generate the output signal OUT having a pulse width of a given range because it performs a retiming operation on the preliminary output signal OUTP using both the first and second division clock signals QCLK and QBCLK regardless of from which one of the first and second synchronization signals SPS1 and SPS2 the preliminary output signal OUTP has been generated.

The signal generation circuit 100 may further include a pulse width control circuit 150. The pulse width control circuit 150 may generate the on-control signal ON and the off-control signal OFF based on operation information of a semiconductor apparatus including the signal generation circuit 100 and operation information of the retiming circuit 130. The operation information of the semiconductor apparatus may include information for determining enabling timing and disabling timing of the output signal OUT and determining a pulse width of the output signal OUT. The operation information of the semiconductor apparatus may include operation latency LAT and operation section information BL. For example, the operation latency LAT may be time information, such as column address strobe (CAS) latency or read latency. The operation section information BL may be time information, such as a burst length. For example, after the first and second input signals INA and INB are input, the signal generation circuit 100 may enable the output signal OUT after a cycle of a clock signal corresponding to the operation latency LAT and may disable the output signal OUT after a cycle of a clock signal corresponding to the operation section information BL.

The operation information of the retiming circuit 130 may be retiming latency. The operation information or retiming latency of the retiming circuit may correspond to a latency time generated when the retiming circuit 130 retimes the preliminary output signal OUTP based on the first and second division clock signals QCLK and QBCLK. The retiming latency may include an on-offset signal OSE and an off-offset signal OSD. The pulse width control circuit 150 may generate the on-control signal ON for determining enabling timing of the output signal OUT based on the operation latency LAT and the on-offset signal OSE. The pulse width control circuit 150 may generate the off-control signal OFF for determining disabling timing of the output signal OUT based on the operation section information BL and the off-offset signal OSD.

Figure 2:
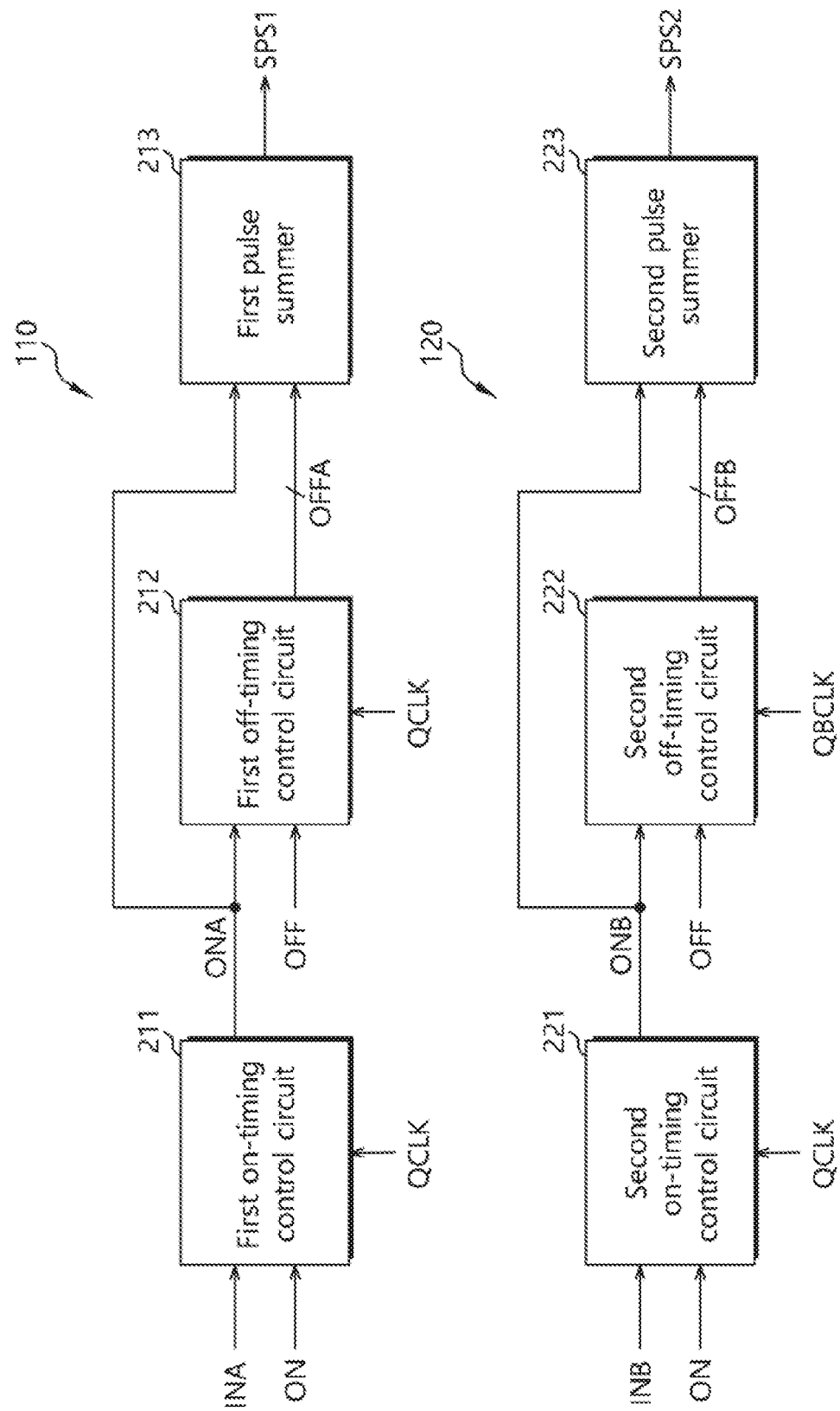
FIG. 2 is a diagram illustrating configurations of a first synchronization signal generation circuit and second synchronization signal generation circuit illustrated in FIG. 1.

FIG. 2 is a diagram illustrating the configurations of the first synchronization signal generation circuit 110 and second synchronization signal generation circuit 120 illustrated in FIG. 1. In FIG. 2, the first synchronization signal generation circuit 110 may include a first on-timing control circuit 211, a first off-timing control circuit 212, and a first pulse summer 213. The first on-timing control circuit 211 may receive the first input signal INA, the first division clock signal QCLK, and the on-control signal ON and generate the even on-pulse signal ONA. The first on-timing control circuit 211 may generate the even on-pulse signal ONA by delaying the first input signal INA by a time corresponding to the on-control signal ON in synchronization with the first division clock signal QCLK. The first on-timing control circuit 211 may generate the even on-pulse signal ONA by delaying the first input signal INA by n cycles of the first division clock signal QCLK. The n may be an integer of 2 or more and may be determined based on the on-control signal ON.

The first off-timing control circuit 212 may receive the even on-pulse signal ONA, the first division clock signal QCLK, and the off-control signal OFF. The first off-timing control circuit 212 may generate the even off-pulse signal OFFA by delaying the even on-pulse signal ONA by a time corresponding to the off-control signal OFF in synchronization with the first division clock signal QCLK. The first off-timing control circuit 212 may generate the even off-pulse signal OFFA by delaying the even on-pulse signal ONA by m cycles of the first division clock signal QCLK. The m may be determined based on the off-control signal OFF.

The first pulse summer 213 may receive the even on-pulse signal ONA and the even off-pulse signal OFFA and output the first synchronization signal SPS1. The first pulse summer 213 may enable the first synchronization signal SPS1 based on the even on-pulse signal ONA, and may disable the first synchronization signal SPS1 based on the even off-pulse signal OFFA. In one embodiment, the first pulse summer 213 may generate the first synchronization signal SPS1 by adding the even on-pulse signal ONA and the m even off-pulse signals OFFA.

The second synchronization signal generation circuit 120 may include a second on-timing control circuit 221, a second off-timing control circuit 222, and a second pulse summer 223. The second on-timing control circuit 221 may receive the second input signal INB, the second division clock signal QBCLK, and the on-control signal ON, and may generate the odd on-pulse signal ONB. The second on-timing control circuit 221 may generate the odd on-pulse signal ONB by delaying the second input signal INB by a time corresponding to the on-control signal ON in synchronization with the second division clock signal QBCLK. The second on-timing control circuit 221 may generate the odd on-pulse signal ONB by delaying the second input signal INB by n cycles of the second division clock signal QBCLK.

The second off-timing control circuit 222 may receive the odd on-pulse signal ONB, the second division clock signal QBCLK, and the off-control signal OFF. The second off-timing control circuit 222 may generate the odd off-pulse signal OFFB by delaying the odd on-pulse signal ONB by a time corresponding to the off-control signal OFF in synchronization with the second division clock signal QBCLK. The second off-timing control circuit 222 may generate the odd off-pulse signal OFFB by delaying the odd on-pulse signal ONB by m cycles of the second division clock signal QBCLK. The m may be determined based on the off-control signal OFF.

The second pulse summer 223 may receive the odd on-pulse signal ONB and the odd off-pulse signal OFFB and output the second synchronization signal SPS2. The second pulse summer 223 may enable the second synchronization signal SPS2 based on the odd on-pulse signal ONB, and may disable the second synchronization signal SPS2 based on the odd off-pulse signal OFFB. In one embodiment, the second pulse summer 223 may generate the second synchronization signal SPS2 by adding the odd on-pulse signal ONB and the m odd off-pulse signals OFFB.

Figure 3:
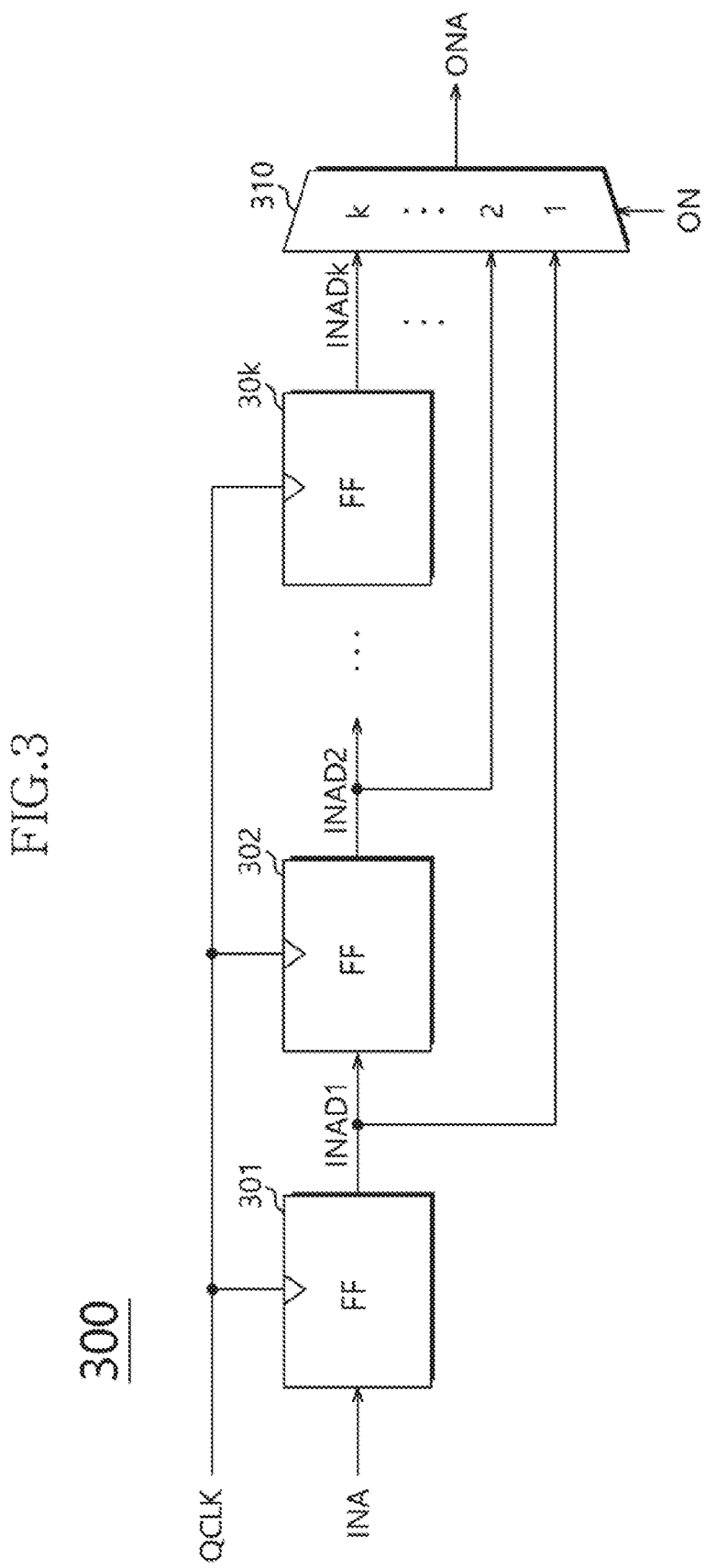
FIG. 3 is a diagram illustrating a configuration of a first on-timing control circuit according to various embodiments.

FIG. 3 is a diagram illustrating a configuration of a first on-timing control circuit 300 according to various embodiments. The first on-timing control circuit 300 may be applied as the first on-timing control circuit 211 illustrated in FIG. 2. In FIG. 3, the first on-timing control circuit 300 may include a plurality of flip-flops (FFs) 301, 302, . . . , and 30k and a multiplexer 310. The plurality of FFs may be electrically coupled in series in a chain structure. The first FF 301 may receive the first input signal INA and the first division clock signal QCLK, and may output a first delay input signal INAD1 by synchronizing the first input signal INA with the first division clock signal QCLK. The second FF 302 may receive the first delay input signal INAD1 and the first division clock signal QCLK, and may output a second delay input signal INAD2 by synchronizing the first delay input signal INAD1 with the first division clock signal QCLK. The second delay input signal INAD2 may be input to the FF of a next stage electrically coupled to the second FF 302. The k-th FF 30k may receive a delay input signal output by the FF of a previous stage, and may output a k-th delay input signal INADk by synchronizing the delay input signal with the first division clock signal QCLK. The k may be a given integer greater than n. The multiplexer 310 may receive signals, output by the plurality of FFs 301, 302, . . . , and 30k, respectively, and the on-control signal ON. The multiplexer 310 may output one of the first to k-th delay input signals INAD1, INAD2, . . . , and INDk, output by the plurality of FFs, as the even on-pulse signal ONA based on the on-control signal ON. If the first on-timing control circuit 300 is configured with a plurality of FFs as illustrated in FIG. 3, each of the first to k-th delay input signals INAD1, INAD2, . . . , and INADk may have a phase difference corresponding to one cycle of the first division clock signal QCLK. The second on-timing control circuit 221 illustrated in FIG. 2 may have the same structure as the first on-timing control circuit 300 except an input signal and an output signal.

Figure 4:
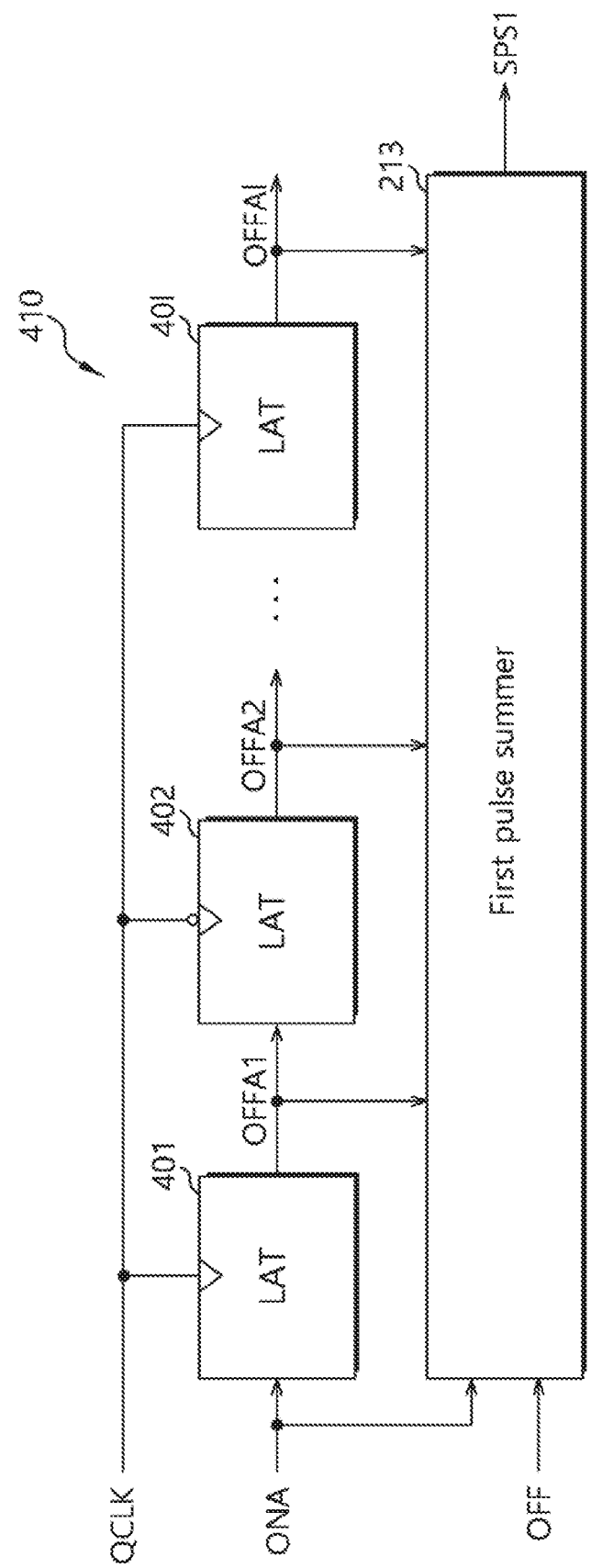
FIG. 4 is a diagram illustrating a configuration of a first off-timing control circuit according to various embodiments.

FIG. 4 is a diagram illustrating a coupling relation between a first off-timing control circuit 410 and the first pulse summer 213 illustrated in FIG. 2 according to various embodiments. The first off-timing control circuit 410 may be applied as the first off-timing control circuit 212 illustrated in FIG. 2. The first off-timing control circuit 410 may include a plurality of latch circuits (LATs) 401, 402, . . . , and 401. The plurality of LATs may be electrically coupled in series in a chain structure. The plurality of LATs may receive the first division clock signal QCLK in common. An odd-numbered LAT of the plurality of LATs may operate in synchronization with the first division clock signal QCLK. An even-numbered LAT of the plurality of LATs may operate in synchronization with the inverted signal of the first division clock signal QCLK. The first LAT 401 may receive the even on-pulse signal ONA, and may output a first even off-pulse signal OFFA1 by synchronizing the even on-pulse signal ONA with the first division clock signal QCLK. The second LAT 402 may receive the first even off-pulse signal OFFA1, and may output a second even off-pulse signal OFFA2 by synchronizing the first even off-pulse signal OFFA1 the inverted signal of the first division clock signal QCLK. The second even off-pulse signal OFFA2 may be input to the LAT of a next stage of the second LAT 402. The I-th LAT 401 may receive an even off-pulse signal output by the LAT of a previous stage, and may output an I-th even off-pulse signal OFFAI by synchronizing the even off-pulse signal with the first division clock signal QCLK.

The first pulse summer 213 may receive the first to I-th even off-pulse signals OFFA1, OFFA2, and OFFAI, the even on-pulse signal ONA and the off-control signal OFF. The first pulse summer 213 may output the first synchronization signal SPS1 by adding an off pulse signal, having a number corresponding to the off-control signal OFF, among the first to I-th even off-pulse signals OFFA1, OFFA2, and OFFAI, and the even on-pulse signal ONA. For example, when the off-control signal OFF is information corresponding to two cycles of the first division clock signal QCLK, the first pulse summer 213 may generate the first synchronization signal SPS1 by adding the even on-pulse signal ONA, the first even off-pulse signal OFFA1, and the second even off-pulse signal OFFA2. Accordingly, the first synchronization signal SPS1 may be enabled when the even on-pulse signal ONA is enabled, and may be disabled when the second even off-pulse signal OFFA2 is disabled. If the first off-timing control circuit 410 is configured with a plurality of LATs configured to alternately receive the first division clock signal QCLK or the inverted signal as illustrated in FIG. 4, each of the first to k-th delay input signals INAD1, INAD2, and INADk may have a phase difference corresponding to one cycle of the clock signal CLK.

The first off-timing control circuit 410 may be implemented using a plurality of FFs and a multiplexer like the first on-timing control circuit 300 illustrated in FIG. 3. In this case, the first pulse summer 213 may receive the even on-pulse signal ONA and only an off pulse signal having a sequence corresponding to the off-control signal OFF, and may be implemented operate in an SR latch manner. For example, when the off-control signal OFF is information corresponding to two cycles of the first division clock signal QCLK, the first pulse summer 213 may enable the first synchronization signal SPS1 in synchronization with a rising edge of the even on-pulse signal ONA, and may disable the first synchronization signal SPS1 in synchronization with a falling edge of the second even off-pulse signal OFFA2. The second off-timing control circuit 222 illustrated in FIG. 2 may have the same structure as the first off-timing control circuit 410 except an input signal and an output signal.

Figure 5:
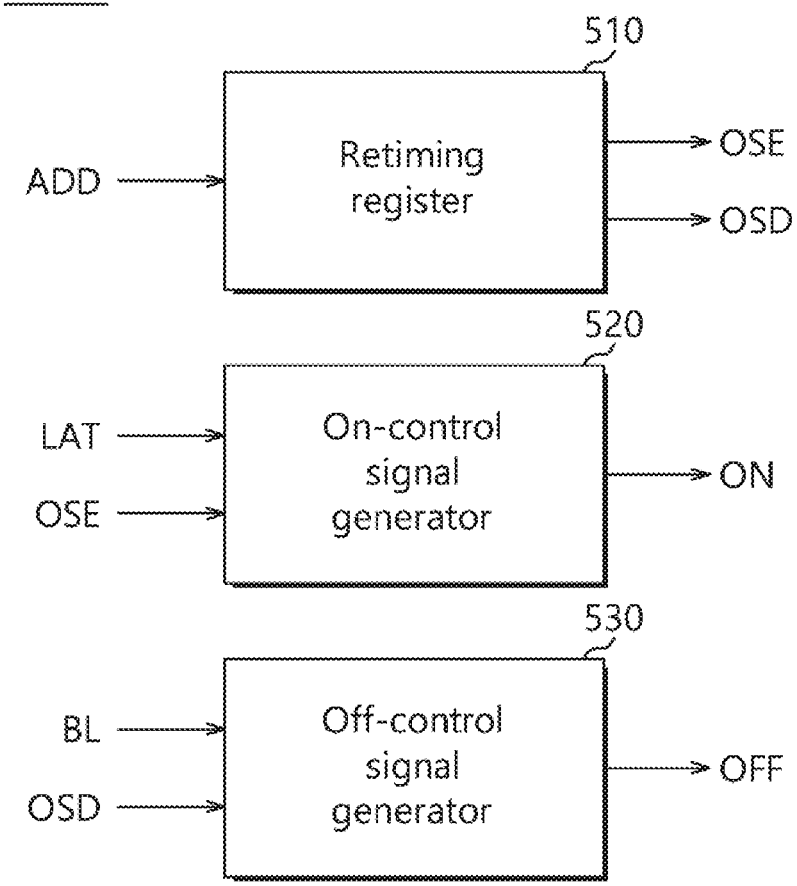
FIG. 5 is a diagram illustrating a configuration of a pulse width control circuit according to various embodiments.

FIG. 5 is a diagram illustrating a configuration of a pulse width control circuit 500 according to various embodiments. The pulse width control circuit 500 may be applied as the pulse width control circuit 150 illustrated in FIG. 1. In FIG. 5, the pulse width control circuit 150 may include a retiming register 510, an on-control signal generator 520, and an off-control signal generator 530. The retiming register 510 may store information of various types of retiming latency according to a characteristic or structure of the retiming circuit 130. The retiming register 510 may output an on-offset signal OSE and off-offset signal OSD corresponding to the retiming latency. The retiming register 510 may receive an address signal ADD, for example, and may output the on-offset signal OSE and off-offset signal OSD corresponding to specific retiming latency based on the address signal ADD.

The on-control signal generator 520 may receive the operation latency LAT and the on-offset signal OSE and generate the on-control signal ON. The on-control signal generator 520 may generate the on-control signal ON by performing an operation on the operation latency LAT and the on-offset signal OSE. For example, the on-control signal generator 520 may generate the on-control signal ON by subtracting the on-offset signal OSE from the operation latency LAT. For example, when the operation latency LAT corresponds to 3 and the on-offset signal OSE corresponds to 1, the on-control signal generator 520 may generate the on-control signal ON corresponding to 2. In the detailed description, integers described as values of latency may have units of time. The unit time may be a time corresponding to one cycle of the clock signal CLK. For example, if the operation latency is 3, this may mean a time corresponding to three cycles of the clock signal CLK. The first on-timing control circuit 211 may generate the even on-pulse signal ONA by delaying the first input signal INA by two cycles of the clock signal CLK (i.e., by one cycle of the first division clock signal QCLK) based on the on-control signal ON.

The off-control signal generator 530 may receive the operation section information BL and the off-offset signal OSD, and may generate the off-control signal OFF. The off-control signal generator 530 may generate the off-control signal OFF by performing an operation on the operation section information BL and the off-offset signal OSD. For example, the off-control signal generator 530 may generate the off-control signal OFF by subtracting the off-offset signal OSD from the operation section information BL. For example, when the operation section information BL corresponds to 8 and the off-offset signal OSD corresponds to 2, the off-control signal generator 530 may generate the off-control signal OFF corresponding to 6. The first off-timing control circuit 212 may generate the even off-pulse signal OFFA by delaying the even on-pulse signal ONA by six cycles of the clock signal CLK (i.e., by three cycles of the first division clock signal) based on the off-control signal OFF.

Figure 6A:
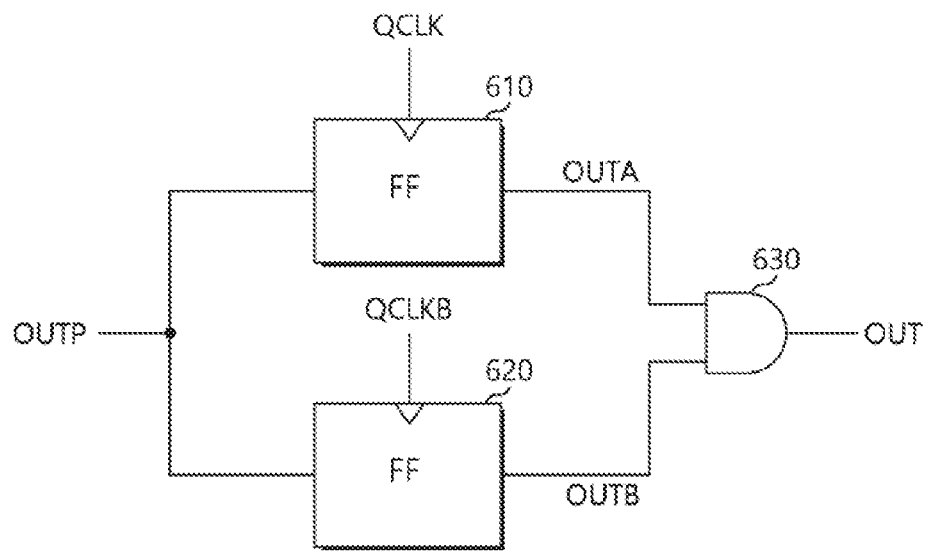
FIGS. 6A and 6B are diagrams illustrating a configuration and operation of a retiming circuit according to various embodiments.
Figure 6B:
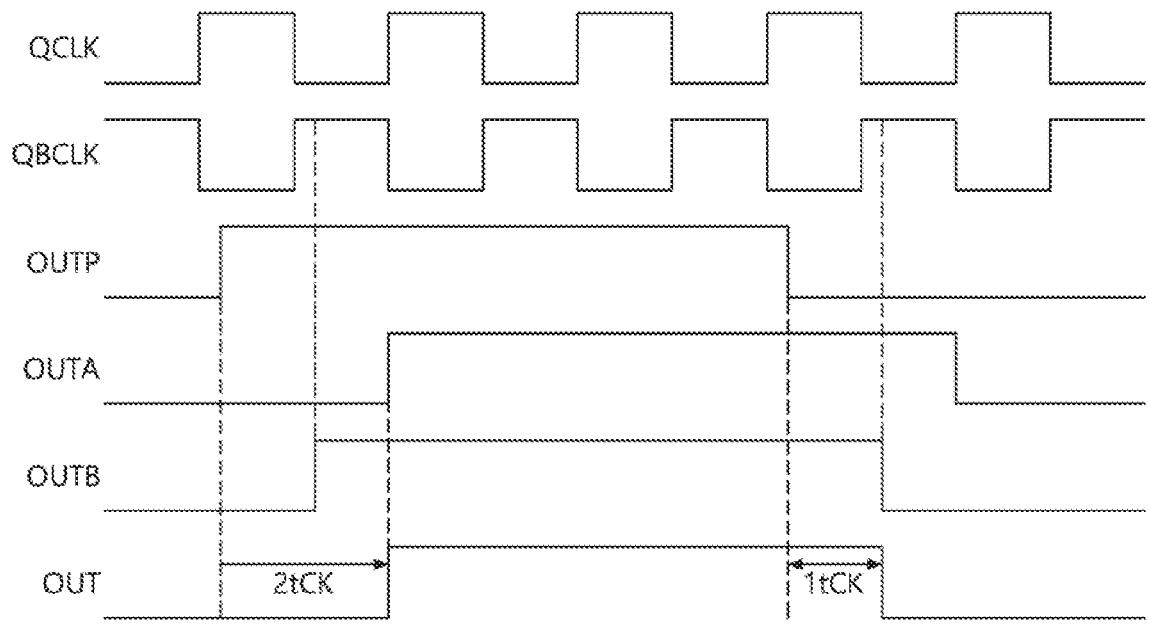

FIG. 6A is a diagram illustrating a configuration of a retiming circuit 600 according to various embodiments. FIG. 6B is a timing diagram illustrating an operation of the retiming circuit 600 illustrated in FIG. 6A. The retiming circuit 600 may be applied as the retiming circuit 130 illustrated in FIG. 1. In FIG. 6A, the retiming circuit 600 may include a first FF 610, a second FF 620, and a logic gate 630. The first FF 610 may receive the preliminary output signal OUTP and the first division clock signal QCLK. The first FF 610 may output an output signal OUTA by synchronizing the preliminary output signal OUTP with the first division clock signal QCLK. The second FF 620 may receive the preliminary output signal OUTP and the second division clock signal QBCLK. The second FF 620 may output an output signal OUTB by synchronizing the preliminary output signal OUTP with the second division clock signal QBCLK. The logic gate 630 may generate the output signal OUT by gating the output signal OUTA of the first FF 610 and the output signal OUTB of the second FF 620. The logic gate 630 may include an AND gate. The logic gate 630 may generate the output signal OUT by performing an AND operation on the output signal OUTA of the first FF 610 and the output signal OUTB of the second FF 620. The retiming circuit 600 may be a retimer of an AND type.

As illustrated in FIG. 6B, when the preliminary output signal OUTP is enabled after a first rising edge of the first division clock signal QCLK occurs and is disabled after a fourth rising edge of the first division clock signal QCLK occurs, the output signal OUTA of the first FF 610 may be enabled in synchronization with a second rising edge of the first division clock signal QCLK and may be disabled in synchronization with a fifth rising edge of the first division clock signal QCLK. Furthermore, the output signal OUTB of the second FF 620 may be enabled in synchronization with a first rising edge of the second division clock signal QBCLK and may be disabled in synchronization with a fourth rising edge of the second division clock signal QBCLK. The logic gate 630 may generate the output signal OUT by AND-gating the output signals OUTA and OUTB of the first and second FFs 610 and 620. Accordingly, the output signal OUT may be delayed and enabled by about one cycle of the first division clock signal QCLK compared to the preliminary output signal OUTP, and may be delayed and disabled by about ½ cycle of the first division clock signal QCLK compared to the preliminary output signal OUTP. That is, the output signal OUT may be delayed and enabled by two cycles of the clock signal CLK (shown in FIG. 6B as 2tCK) compared to the preliminary output signal OUTP, and may be delayed and disabled by one cycle of the clock signal CLK (shown in FIG. 6B as 1tCK) compared to the preliminary output signal OUTP. Accordingly, the on-offset signal OSE during the retiming latency of the retiming circuit 600 may correspond to 2. The off-offset signal OSD during the retiming latency of the retiming circuit 600 may correspond to 1. That is, in the retiming circuit 600, as the preliminary output signal OUTP is retimed based on the first and second division clock signals QCLK and QBCLK, enabling timing of the output signal OUT may be delayed by two cycles of the clock signal CLK compared to enabling timing of the preliminary output signal OUTP, and disabling timing of the output signal OUT may be delayed by one cycle of the clock signal CLK compared to disabling timing of the preliminary output signal OUTP. Accordingly, the pulse width control circuit 150 may previously compensate for a delay quantity occurring in the retiming circuit 600 by adjusting the on-control signal ON and the off-control signal OFF based on the on-offset signal OSE and off-offset signal OSD corresponding to the retiming latency of the retiming circuit 600. If the signal generation circuit 100 illustrated in FIG. 1 adopts the retiming circuit 600 illustrated in FIG. 6A, the on-control signal ON may correspond to a value obtained by subtracting 2 from the operation latency LAT, and the off-control signal OFF may correspond to a value obtained by subtracting 1 from the operation section information BL.

Figure 7A:
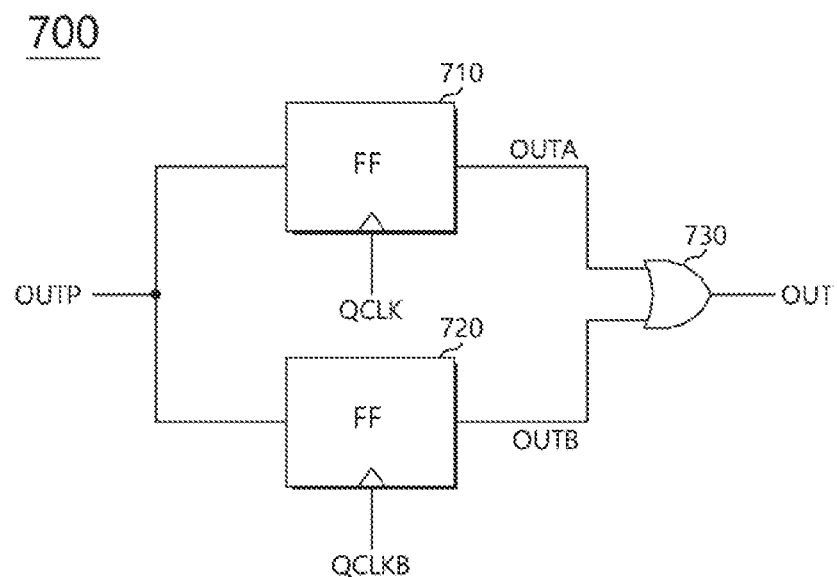
FIGS. 7A and 7B are diagrams illustrating a configuration and operation of a retiming circuit according to various embodiments.
Figure 7B:
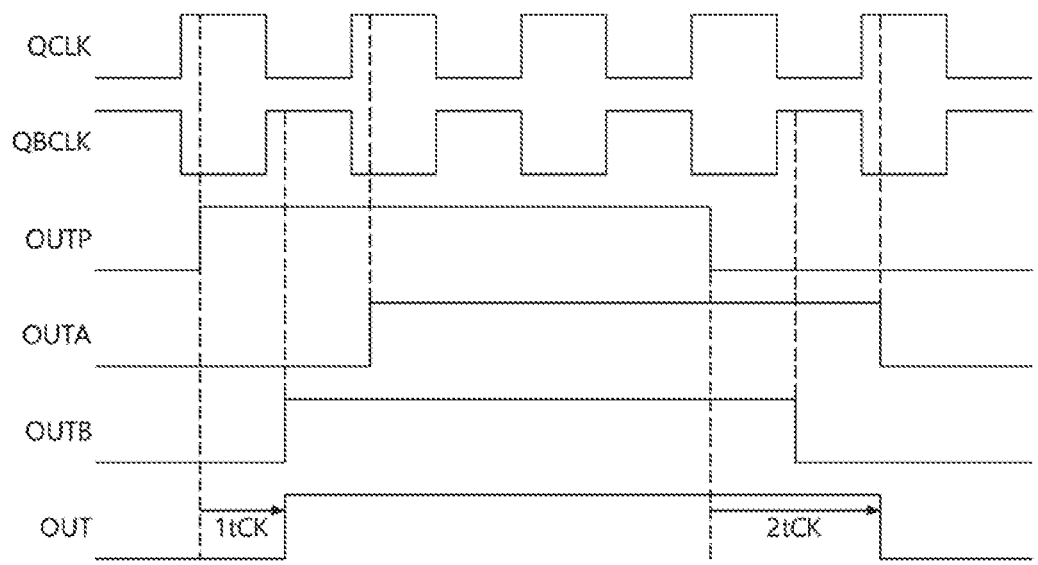

FIG. 7A is a diagram illustrating a configuration of a retiming circuit 700 according to various embodiments. FIG. 7B is a timing diagram illustrating an operation of the retiming circuit 700 illustrated in FIG. 7A. The retiming circuit 700 may be applied as the retiming circuit 130 illustrated in FIG. 1. In FIG. 7A, the retiming circuit 700 may include a first FF 710, a second FF 720, and a logic gate 730. The first FF 710 may receive the preliminary output signal OUTP and the first division clock signal QCLK. The first FF 710 may output the output signal OUTA by synchronizing the preliminary output signal OUTP with the first division clock signal QCLK. The second FF 720 may receive the preliminary output signal OUTP and the second division clock signal QBCLK. The second FF 720 may output the output signal OUTB by synchronizing the preliminary output signal OUTP with the second division clock signal QBCLK. The logic gate 730 may generate the output signal OUT by gating the output signal OUTA of the first FF 710 and the output signal OUTB of the second FF 720. The logic gate 730 may include an OR gate. The logic gate 730 may generate the output signal OUT by performing an OR operation on the output signal OUTA of the first FF 710 and the output signal OUTB of the second FF 720. The retiming circuit 700 may be a retimer of an OR type.

As illustrated in FIG. 7B, when the preliminary output signal OUTP is enabled after a first rising edge of the first division clock signal QCLK occurs and is disabled after a fourth rising edge of the first division clock signal QCLK occurs, the output signal OUTA of the first FF 710 may be enabled in synchronization with a second rising edge of the first division clock signal QCLK, and may be disabled in synchronization with a fifth rising edge of the first division clock signal QCLK. Furthermore, the output signal OUTB of the second FF 720 may be enabled in synchronization with a first rising edge of the second division clock signal QBCLK, and may be disabled in synchronization with a fourth rising edge of the second division clock signal QBCLK. The logic gate 730 may generate the output signal OUT by OR-gating the output signals OUTA and OUTB of the first and second FFs 710 and 720. Accordingly, the output signal OUT may be delayed and enabled by about one cycle of the clock signal CLK (shown in FIG. 7B as 1tCK) compared to the preliminary output signal OUTP, and may be delayed and disabled by about two cycles of the clock signal CLK (shown in FIG. 7B as 2tCK) compared to the preliminary output signal OUTP. Accordingly, the on-offset signal OSE during the retiming latency of the retiming circuit 700 may correspond to 1. The off-offset signal OSD during the retiming latency of the retiming circuit 700 may correspond to 2. That is, in the retiming circuit 700, as the preliminary output signal OUTP is retimed based on the first and second division clock signals QCLK and QBCLK, enabling timing of the output signal OUT may be delayed by one cycle of the clock signal CLK compared to enabling timing of the preliminary output signal OUTP, and disabling timing of the output signal OUT may be delayed by two cycles of the clock signal CLK compared to disabling timing of the preliminary output signal OUTP. Accordingly, the pulse width control circuit 150 may previously compensate for a delay quantity occurring in the retiming circuit 700 by adjusting the on-control signal ON and the off-control signal OFF based on the on-offset signal OSE and off-offset signal OSD corresponding to the retiming latency of the retiming circuit 700. If the signal generation circuit 100 illustrated in FIG. 1 adopts the retiming circuit 700 illustrated in FIG. 7A, the on-control signal ON may correspond to a value obtained by subtracting 1 from the operation latency LAT, and the off-control signal OFF may correspond to a value obtained by subtracting 2 from the operation section information BL.

Figure 8:
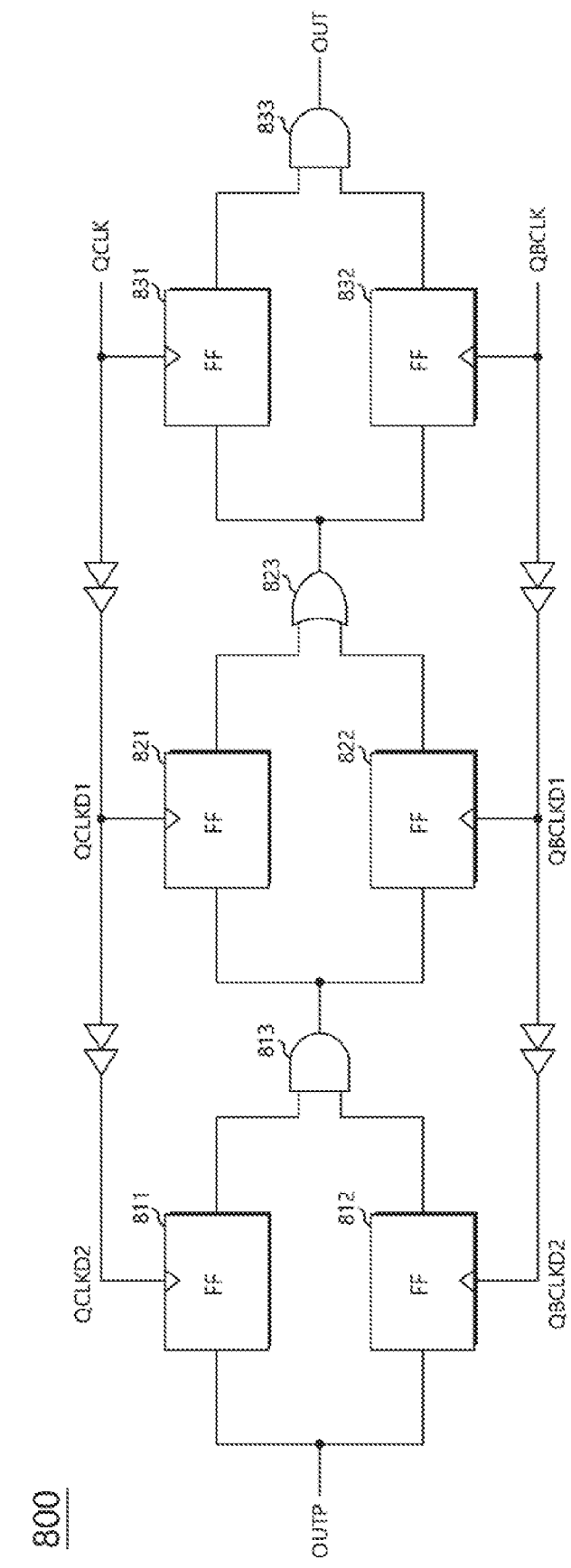
FIG. 8 is a diagram illustrating a configuration of a retiming circuit according to various embodiments.

FIG. 8 is a diagram illustrating a configuration of a retiming circuit 800 according to various embodiments. The retiming circuit 800 may be applied as the retiming circuit 130 illustrated in FIG. 1. In FIG. 8, the retiming circuit 800 may have a form in which at least one of the retimer of an AND type illustrated in FIG. 6A and the retimer of an OR type illustrated in FIG. 7A has been combined. In FIG. 8, the retiming circuit 800 may have a form in which two retimers of an AND type and one retimer of an OR type are combined. The retiming circuit 800 may include a first FF 811, a second FF 812, a first logic gate 813, a third FF 821, a fourth FF 822, a second logic gate 823, a fifth FF 831, a sixth FF 832, and a third logic gate 833. The fifth FF 831 may receive the first division clock signal QCLK. The third FF 821 may receive a first delay clock signal QCLKD1 delayed by a first time from the first division clock signal QCLK. The first FF 811 may receive a second delay clock signal QCLKD2 delayed by a second time from the first delay clock signal QCLKD1. The sixth FF 832 may receive the second division clock signal QBCLK. The fourth FF 822 may receive a third delay clock signal QBCLKD1 delayed by one time from the second division clock signal QBCLK. The second FF 812 may receive a fourth delay clock signal QBCLKD2 delayed by two times from the third delay clock signal QBCLKD1. When the retiming circuit 800 includes a plurality of FFs that are electrically coupled in series, an FF close to the output terminal of the retiming circuit 800 among the plurality of FFs may be configured to receive a clock signal having an early phase, and an FF close to the input terminal of the retiming circuit 800 among the plurality of FFs may be configured to receive a clock signal having a late phase. The first logic gate 813 may be an AND gate. The second logic gate 823 may be an OR gate. The third logic gate 833 may be an AND gate.

The first FF 811 may output a signal by synchronizing the preliminary output signal OUTP with the second delay clock signal QCLKD2. The second FF 812 may output a signal by synchronizing the preliminary output signal OUTP with the fourth delay clock signal QBCLKD2. The first logic gate 813 may output an output by AND-gating the signals output by the first and second FFs 811 and 812. The third FF 821 may output a signal by synchronizing the output of the first logic gate 813 with the first delay clock signal QCLKD1. The fourth FF 822 may output a signal by synchronizing the output of the first logic gate 813 with the third delay clock signal QBCLKD1. The second logic gate 823 may output an output by OR-gating the signals output by the third and fourth FFs 821 and 822. The fifth FF 831 may output a signal by synchronizing the output of the second logic gate 823 with the first division clock signal QCLK. The sixth FF 832 may output a signal by synchronizing the output of the second logic gate 823 with the second division clock signal QBCLK. The third logic gate 833 may output the output signal OUT by AND-gating the signals output by the fifth and sixth FFs 831 and 832.

The retiming circuit 800 may have a structure in which a retimer of an AND type, a retimer of an OR type, and a retimer of an AND type have been sequentially and electrically coupled. Accordingly, the output signal OUT output by the retiming circuit 800 may be delayed and enabled by five cycles of the clock signal CLK compared to the preliminary output signal OUTP, and may be delayed and disabled by four cycles of the clock signal CLK. An on-offset signal OSE related to the retiming circuit 800 may have a value corresponding to 5. An off-offset signal OSD related to the retiming circuit 800 may have a value corresponding to 4. When the signal generation circuit 100 adopts the retiming circuit 800, the pulse width control circuit 150 may generate an on-control signal ON corresponding to a value obtained by subtracting 5 from the operation latency LAT, and may generate an off-control signal OFF corresponding to a value obtained by subtracting 4 from the operation section information BL.

Figure 9:
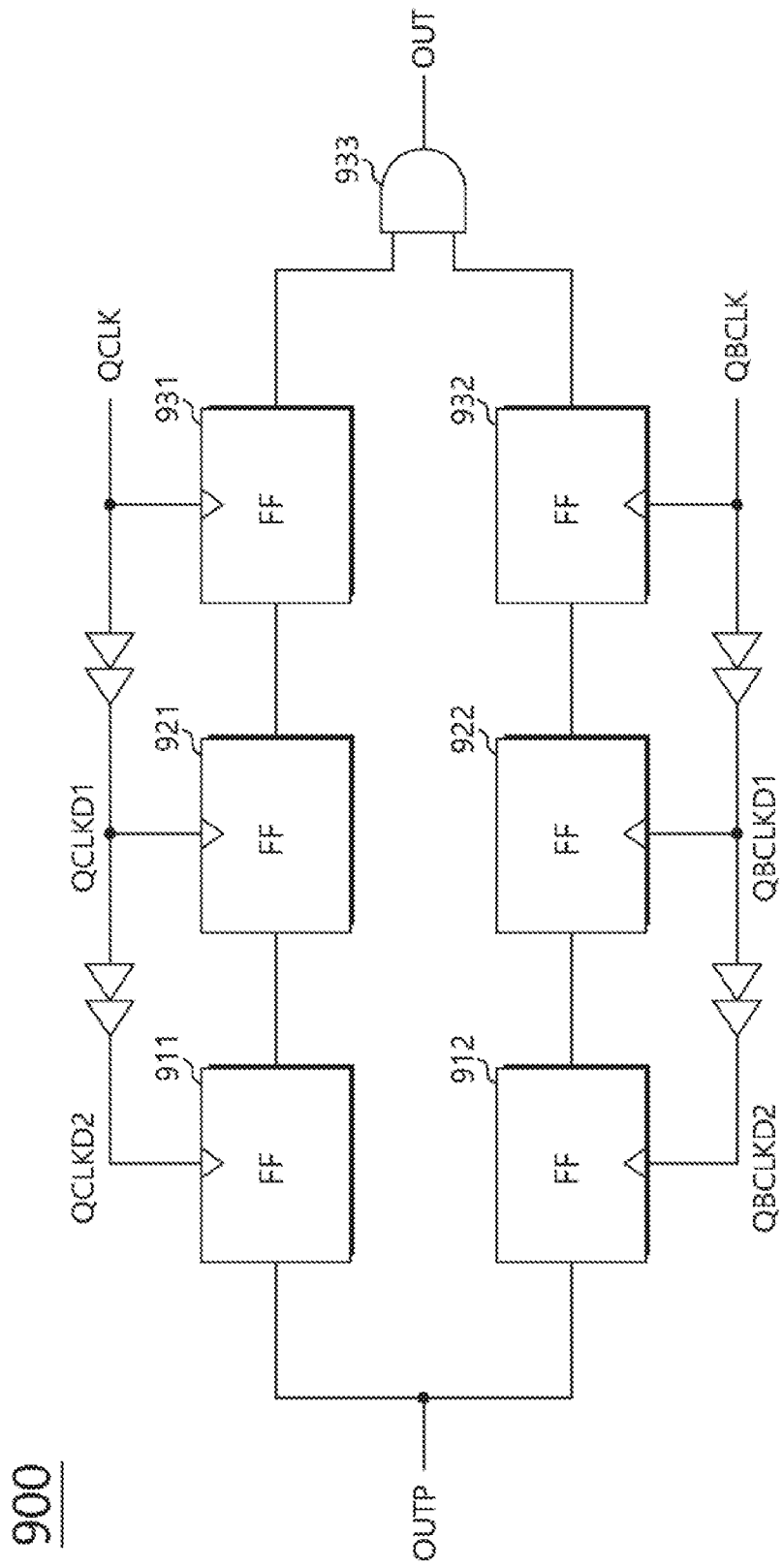
FIG. 9 is a diagram illustrating a configuration of a retiming circuit according to various embodiments.

FIG. 9 is a diagram illustrating a configuration of a retiming circuit 900 according to various embodiments. The retiming circuit 900 may be applied as the retiming circuit 130 illustrated in FIG. 1. In FIG. 9, the retiming circuit 900 may include a first FF 911, a second FF 912, a third FF 921, a fourth FF 922, a fifth FF 931, a sixth FF 932, and a logic gate 933. Unlike in FIG. 8, in the retiming circuit 900, signals output by the first and second FFs 911 and 912 might not be gated by a logic gate, and may be input to the third and fourth FFs 921 and 922, respectively. Signals output by the third and fourth FFs 921 and 922 might not be gated by a logic gate, and may be input to the fifth and sixth FFs 931 and 932, respectively. A portion configured with only two FFs without a logic gate may be a retimer of an FF type. The output signal of the retimer of an FF type may be delayed and enabled by one cycle of the first or second division clock signal QCLK or QBCLK or two cycles of the clock signal CLK compared to an input signal, and may be delayed and disabled by one cycle of the first or second division clock signal QCLK or QBCLK or two cycles of the clock signal CLK.

The first FF 911 may output a signal by synchronizing the preliminary output signal OUTP with the second delay clock signal QCLKD2. The second FF 912 may output a signal by synchronizing the preliminary output signal OUTP with the fourth delay clock signal QBCLKD2. The third FF 921 may output a signal by synchronizing the signal, output by the first FF 911, with the first delay clock signal QCLKD1. The fourth FF 922 may output a signal by synchronizing the signal, output by the second FF 912, with the third delay clock signal QBCLKD1. The fifth FF 931 may output a signal by synchronizing the signal, output by the third FF 921, with the first division clock signal QCLK. The sixth FF 932 may output a signal by synchronizing the signal, output by the fourth FF 922, with the second division clock signal QBCLK. The logic gate 933 may be an AND gate. The logic gate 933 may generate the output signal OUT by AND-gating the signals output by the fifth and sixth FFs 931 and 932.

In FIG. 9, the retiming circuit 900 may have a form in which two retimers of an FF type and one retimer of an AND type have been combined. Accordingly, the output signal OUT output by the retiming circuit 900 may be delayed and enabled by six cycles of the clock signal CLK compared to the preliminary output signal OUTP, and may be delayed and disabled by five cycles of the clock signal CLK compared to the preliminary output signal OUTP. An on-offset signal OSE related to the retiming circuit 900 may have a value corresponding to 6. An off-offset signal OSD related to the retiming circuit 900 may have a value corresponding to 5. When the signal generation circuit 100 adopts the retiming circuit 900, the pulse width control circuit 150 may generate an on-control signal ON corresponding to a value obtained by subtracting 6 from the operation latency LAT, and may generate an off-control signal OFF corresponding to a value obtained by subtracting 5 from the operation section information BL.

In an embodiment, the logic gate 933 may be substituted with an OR gate. In this case, an on-offset signal OSE related to the retiming circuit 900 may have a value corresponding to 5, and an off-offset signal OSD related to the retiming circuit 900 may have a value corresponding to 6. The pulse width control circuit 150 may generate an on-control signal ON corresponding to a value obtained by subtracting 5 from the operation latency LAT, and may generate an off-control signal OFF corresponding to a value obtained by subtracting 6 from the operation section information BL.

Figure 10:
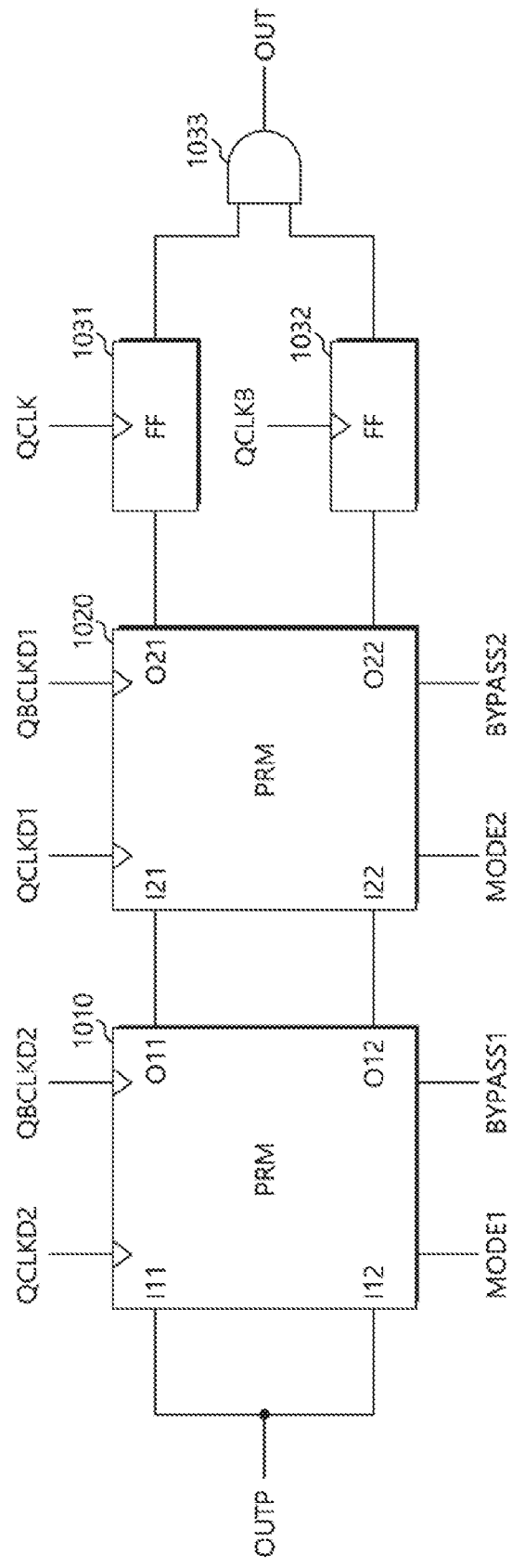
FIG. 10 is a diagram illustrating a configuration of a retiming circuit according to various embodiments.

FIG. 10 is a diagram illustrating a configuration of a retiming circuit 1000 according to various embodiments. The retiming circuit 1000 may be applied as the retiming circuit 130 illustrated in FIG. 1. The retiming circuit 1000 may include at least one programmable retiming module (PRM). The programmable retiming module may receive a mode signal and a bypass signal. The latency of the programmable retiming module may be determined based on the mode signal and the bypass signal. The programmable retiming module may operate as one of the retiming circuit of an AND type, the retiming circuit of an OR type, and the retiming circuit of an FF type based on the mode signal and the bypass signal.

In FIG. 10, the retiming circuit 1000 may include a first PRM 1010, a second PRM 1020, and a retimer of an AND type. Each of the first and second PRMs 1010 and 1020 may include two input terminals and two output terminals. The first PRM 1010 may receive a first mode signal MODE1 and a first bypass signal BYPASS1. The second PRM 1020 may receive a second mode signal MODE2 and a second bypass signal BYPASS2. The first PRM 1010 may operate as one of a retimer of an AND type, a retimer of an OR type, and a retimer of an FF type based on the first mode signal MODE1 and the first bypass signal BYPASS1. The second PRM 1020 may operate as one of a retimer of an AND type, a retimer of an OR type, and a retimer of an FF type based on the second mode signal MODE2 and the second bypass signal BYPASS2.

The first PRM 1010 may receive the preliminary output signal OUTP through each of first and second input terminals I11 and I12, and may output signals by synchronizing the preliminary output signal OUTP with the second delay clock signal QCLKD2 and the fourth delay clock signal QBCLKD2. The first PRM 1010 may AND-gate or OR-gate the signals, output in synchronization with the second and fourth delay clock signals QCLKD2 and QBCLKD2, based on the first mode signal MODE1. The first PRM 1010 may output the signals, output in synchronization with the second and fourth clock signals QCLKD2 and QBCLKD2, to first and second output terminals O11 and O12, respectively, based on the bypass signal BYPASS1, or may output the AND-gated or OR-gated signals to the first and second output terminals O11 and O12.

First and second input terminals I21 and I22 of the second PRM 1020 may be electrically coupled to the first and second output terminals O11 and O12 of the first PRM 1010, respectively. The second PRM 1020 may output a signal by synchronizing the signal, output by the first output terminal O11 of the first PRM 1010, with the first delay clock signal QCLKD1, and may output a signal by synchronizing the signal, output by the second output terminal O12 of the first PRM 1010, with the third delay clock signal QBCLKD1. The second PRM 1020 may AND-gate or OR-gate the signals, output in synchronization with the first and third delay clock signals QCLKD1 and QBCLKD1, based on the second mode signal MODE2. The second PRM 1020 may output the signals, output in synchronization with the first and third delay clock signals QCLKD1 and QBCLKD2, to first and second output terminals O21 and O22, respectively, based on the second bypass signal BYPASS2, or may output the AND-gated or OR-gated signals to the first and second output terminals O21 and O22.

A first FF 1031 may output a signal by synchronizing the signal, output by the first output terminal O21 of the second PRM 1020, with the first division clock signal QCLK. The second FF 1032 may output a signal by synchronizing the signal, output by the second output terminal O22 of the second PRM 1020, with the second division clock signal QBCLK. A logic gate 1033 may generate the output signal OUT by AND-gating the signals output by the first and second FFs 1031 and 1032. An on-offset signal OSE and off-offset signal OSD of the retiming circuit 1000 may be determined by the first and second mode signals MODE1 and MODE2 and the first and second bypass signals BYPASS1 and BYPASS2.

Figure 11:
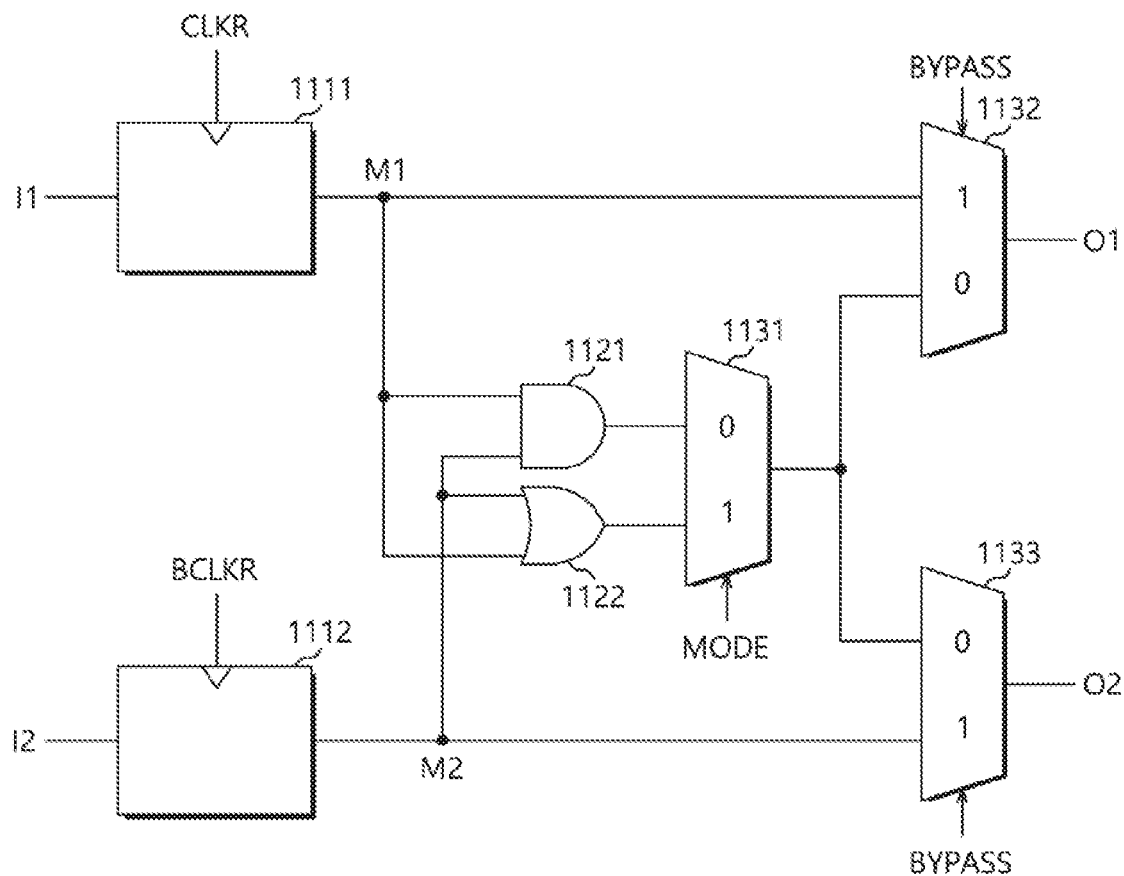
FIG. 11 is a diagram illustrating a configuration of a programmable retiming module illustrated in FIG. 10.

FIG. 11 is a diagram illustrating a configuration of a programmable retiming module (PRM) 1100 according to various embodiments. The PRM 1100 may be applied as each of the first and second PRMs 1010 and 1020 illustrated in FIG. 10. In FIG. 11, the PRM 1100 may include a first FF 1111, a second FF 1112, an AND gate 1121, an OR gate 1122, a first multiplexer 1131, a second multiplexer 1132, and a third multiplexer 1133. The first FF 1111 may receive a signal through a first input terminal I1, and may output an output signal M1 by synchronizing the received signal with a received clock signal CLKR. The second FF 1112 may receive a signal through a second input terminal I2, and may output an output signal M2 by synchronizing the received signal with a received clock signal BCLKR. For example, the clock signal CLKR received by the first FF 1111 may be the first division clock signal QCLK, the first delay clock signal QCLKD1, or the second delay clock signal QCLKD2. The clock signal BCLKR received by the second FF 1112 may be the second division clock signal QBCLK, the third delay clock signal QBCLKD1, or the fourth delay clock signal QBCLKD2.

The AND gate 1121 may output a signal by AND-gating the output signals M1 and M2 of the first and second FFs 1111 and 1112. The OR gate 1122 may output a signal by OR-gating the output signals M1 and M2 of the first and second FFs 1111 and 1112. The first multiplexer 1131 may receive the signals output by the AND gate 1121 and the OR gate 1122, and may output one of the signals based on a mode signal MODE. For example, when a level of the mode signal MODE is a logic low level, the first multiplexer 1131 may output the signal output by the AND gate 1121. When a level of the mode signal MODE is a logic high level, the first multiplexer 1131 may output the signal output by the OR gate 1122.

The second multiplexer 1132 may receive the output signal M1 of the first FF 1111 and the signal output by the first multiplexer 1131. The second multiplexer 1132 may output one of the signals to a first output terminal O1 based on the bypass signal BYPASS. For example, when a level of the bypass signal BYPASS is a logic high level, the second multiplexer 1132 may output the output signal M1 of the first FF 1111 to the first output terminal O1. When a level of the bypass signal BYPASS is a logic low level, the second multiplexer 1132 may output, to the first output terminal O1, the signal output by the first multiplexer 1131.

The third multiplexer 1133 may receive the output signal M2 of the second FF 1112 and the signal output by the first multiplexer 1131. The third multiplexer 1133 may output one of the signals to a second output terminal O2 based on the bypass signal BYPASS. For example, when a level of the bypass signal BYPASS is a logic high level, the third multiplexer 1133 may output the output signal M2 of the second FF 1112 to the second output terminal O2. When a level of the bypass signal BYPASS is a logic low level, the third multiplexer 1133 may output, to the second output terminal O2, the signal output by the first multiplexer 1131.

FIG. 12 is a table illustrating retiming latency of the PRM set in response to a mode signal MODE and a bypass signal BYPASS. Referring to FIG. 12, when both levels of the bypass signal BYPASS and the mode signal MODE are logic low levels, the PRM 1100 may operate as a retimer of an AND type. Accordingly, the on-offset signal OSE of the PRM 1100 may have a value corresponding to 2, and the off-offset signal OSD of the PRM 1100 may have a value corresponding to 1. When a level of the bypass signal BYPASS is a logic low level and a level of the mode signal MODE is a logic high level, the PRM 1100 may operate as a retimer of an OR type. Accordingly, the on-offset signal OSE of the PRM 1100 may have a value corresponding to 1, and the off-offset signal OSD of the PRM 1100 may have a value corresponding to 2. When a level of the bypass signal BYPASS is a logic high level, the PRM 1100 may operate as a retimer of an FF type regardless of a logic level of the mode signal MODE. Accordingly, the on-offset signal OSE of the PRM 1100 may have a value corresponding to 2, and the off-offset signal OSD of the PRM 1100 may have a value corresponding to 2.

Figure 13:
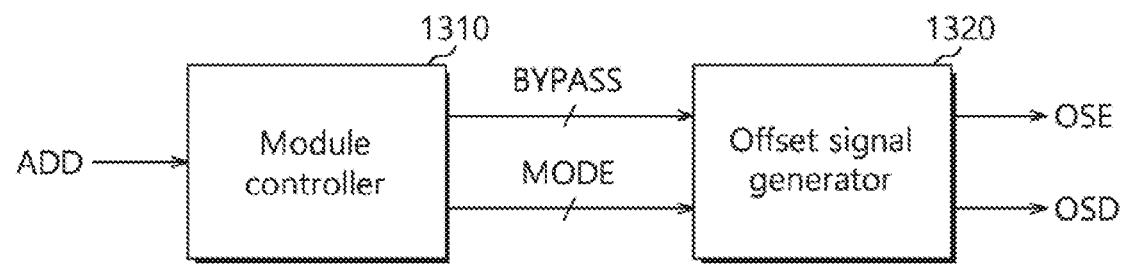
FIG. 13 is a diagram illustrating a configuration of at least some of a pulse width control circuit according to various embodiments.

FIG. 13 is a diagram illustrating a configuration of at least some of a pulse width control circuit 1300 according to various embodiments. In FIG. 13, the pulse width control circuit 1300 may include a module controller 1310 and an offset signal generator 1320. The module controller 1310 may generate a plurality of mode signals MODE and a plurality of bypass signals BYPASS for controlling a plurality of PRMs. The module controller 1310 may receive an address signal ADD and generate the plurality of mode signals MODE and the plurality of bypass signals BYPASS. The module controller 1310 may generate the plurality of mode signals MODE and the plurality of bypass signals BYPASS having various combinations of logic levels based on the address signal ADD. The offset signal generator 1320 may receive the plurality of mode signals MODE and the plurality of bypass signals BYPASS, and may generate an on-offset signal OSE and an off-offset signal OSD based on a combination of logic levels of the plurality of mode signals MODE and a combination of logic levels of the plurality of bypass signals BYPASS. The on-offset signal OSE and the off-offset signal OSD may be input to the on-control signal generator 520 and off-control signal generator 530 illustrated in FIG. 5.

Figure 14:
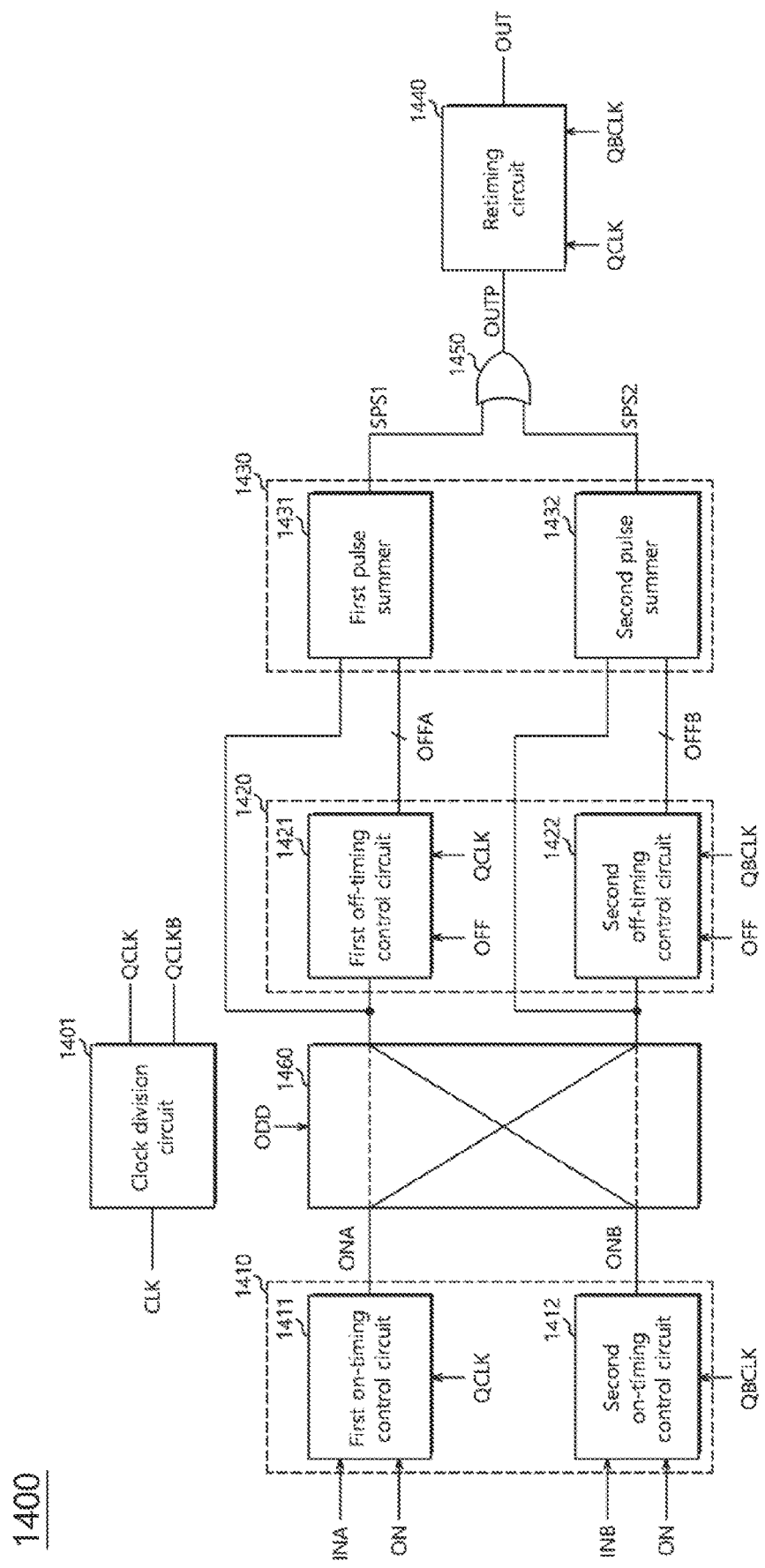
FIG. 14 is a diagram illustrating a configuration of a signal generation circuit according to various embodiments.

FIG. 14 is a diagram illustrating a configuration of a signal generation circuit 1400 according to various embodiments. In FIG. 14, the signal generation circuit 1400 may have a configuration similar to that of the signal generation circuit 100, the first synchronization signal generation circuit 110 and the second synchronization signal generation circuit 120, which are illustrated in FIGS. 1 and 2. A redundant description of the same element is omitted. In FIG. 14, the signal generation circuit 1400 may include a clock division circuit 1401, an on-pulse generation circuit 1410, an off-pulse generation circuit 1420, a pulse sum circuit 1430 and a retiming circuit 1440. The on-pulse generation circuit 1410 may generate an even on-pulse signal ONA by delaying a first input signal INA based on a first division clock signal QCLK and an on-control signal ON, and may generate an odd on-pulse signal ONB by delaying a second input signal INB based on a second division clock signal QBCLK and the on-control signal ON. The off-pulse generation circuit 1420 may generate a plurality of even off-pulse signals OFFA by delaying one of the even on-pulse signal ONA and the odd on-pulse signal ONB based on the first division clock signal QCLK and an off-control signal OFF, and may generate a plurality of odd off-pulse signals OFFB by delaying one of the even on-pulse signal ONA and the odd on-pulse signal ONB based on the second division clock signal QBCLK and the off-control signal OFF.

The pulse sum circuit 1430 may generate a first synchronization signal SPS1 by combining one of the even on-pulse signal ONA and the odd on-pulse signal ONB and the plurality of even off-pulse signals OFFA, and may generate a second synchronization signal SPS2 by combining one of the even on-pulse signal ONA and the odd on-pulse signal ONB and the plurality of odd off-pulse signals OFFB. The retiming circuit 1440 may generate an output signal OUT by retiming a preliminary output signal OUTP, generated from one of the first and second synchronization signals SPS1 and SPS2, based on the first and second division clock signals QCLK and QBCLK.

The on-pulse generation circuit 1410 may include a first on-timing control circuit 1411 and a second on-timing control circuit 1412. The first on-timing control circuit 1411 may generate the even on-pulse signal ONA by delaying the first input signal INA based on the on-control signal ON and the first division clock signal QCLK. The second on-timing control circuit 1412 may generate the odd on-pulse signal ONB by delaying the second input signal INB based on the on-control signal ON and the second division clock signal QBCLK.

The off-pulse generation circuit 1420 may include a first off-timing control circuit 1421 and a second off-timing control circuit 1422. The first off-timing control circuit 1421 may generate the plurality of even off-pulse signals OFFA by delaying one of the even on-pulse signal ONA and the odd on-pulse signal ONB based on the off-control signal OFF and the first division clock signal QCLK. The second off-timing control circuit 1422 may generate the plurality of odd off-pulse signals OFFB by delaying one of the even on-pulse signal ONA and the odd on-pulse signal ONB based on the off-control signal OFF and the second division clock signal QBCLK.

The pulse sum circuit 1430 may include a first pulse summer 1431 and a second pulse summer 1432. The first pulse summer 1431 may generate the first synchronization signal SPS1 by adding one of the even on-pulse signal ONA and the odd on-pulse signal ONB and the plurality of even off-pulse signals OFFA. The second pulse summer 1432 may generate the second synchronization signal SPS2 by adding one of the even on-pulse signal ONA and the odd on-pulse signal ONB and the plurality of odd off-pulse signals OFFB. The signal generation circuit 1400 may further include a gating circuit 1450. The gating circuit 1450 may generate the preliminary output signal OUTP by OR-gating the first and second synchronization signals SPS1 and SPS2.

The signal generation circuit 1400 may further include a switching circuit 1460. The switching circuit 1460 may receive an odd flag ODD. The switching circuit 1460 may output the even on-pulse signal ONA to one of the first and second off-timing control circuits 1421 and 1422 based on the odd flag signal ODD, and may output the odd on-pulse signal ONB to one of the first and second off-timing control circuits 1421 and 1422 based on the odd flag signal ODD. When the first or second on-timing control circuit 1411 or 1412 is implemented as the first on-timing control circuit 300 illustrated in FIG. 3, a unit delay quantity of the first or second on-timing control circuit 1411 or 1412 may correspond to one cycle of the first division clock signal QCLK or two cycles of the clock signal CLK. That is, the unit delay quantity of the first or second on-timing control circuit 1411 or 1412 may be twice a unit time. In contrast, a unit delay quantity of the first or second off-timing control circuit 1421 or 1422 may correspond to ½ cycle of the first division clock signal QCLK or one cycle of the clock signal CLK. Accordingly, when the on-control signal ON corresponds to an odd number, the first or second on-timing control circuit 1411 or 1412 cannot generate an on pulse signal ONA delayed by a time corresponding to an odd on-control signal ON.

The odd flag ODD may have a logic high level when the on-control signal ON corresponds to an odd number, and may have a logic low level when the on-control signal ON corresponds to an even number. The switching circuit 1460 may output the even on-pulse signal ONA to the second off-timing control circuit 1422 and output the odd on-pulse signal ONB to the first off-timing control circuit 1421, when the odd flag ODD has a logic high level. The switching circuit 1460 may output the even on-pulse signal ONA to the first off-timing control circuit 1421 and output the odd on-pulse signal ONB to the second off-timing control circuit 1422, when the odd flag ODD has a logic low level. For example, the signal generation circuit 1400 may operate as follows. When the on-control signal ON is 5, the on-control signal ON is an odd number. Accordingly, the first on-timing control circuit 1411 may generate the even on-pulse signal ONA by delaying the first input signal INA by six cycles of the clock signal CLK. The switching circuit 1460 may output the even on-pulse signal ONA to the second off-timing control circuit 1422 based on the odd flag ODD. The second off-timing control circuit 1422 may operate in synchronization with the second division clock signal QBCLK, and thus may delay the even on-pulse signal ONA at timing prior to a phase of 180 degrees compared to a case where the even on-pulse signal ONA is delayed in synchronization with the first division clock signal QCLK. Accordingly, when the on-control signal ON corresponds to an odd number, a time additionally delayed in the first or second on-timing control circuit 1411 or 1412 may be compensated for by the first or second off-timing control circuit 1421 or 1422.

Figure 15:
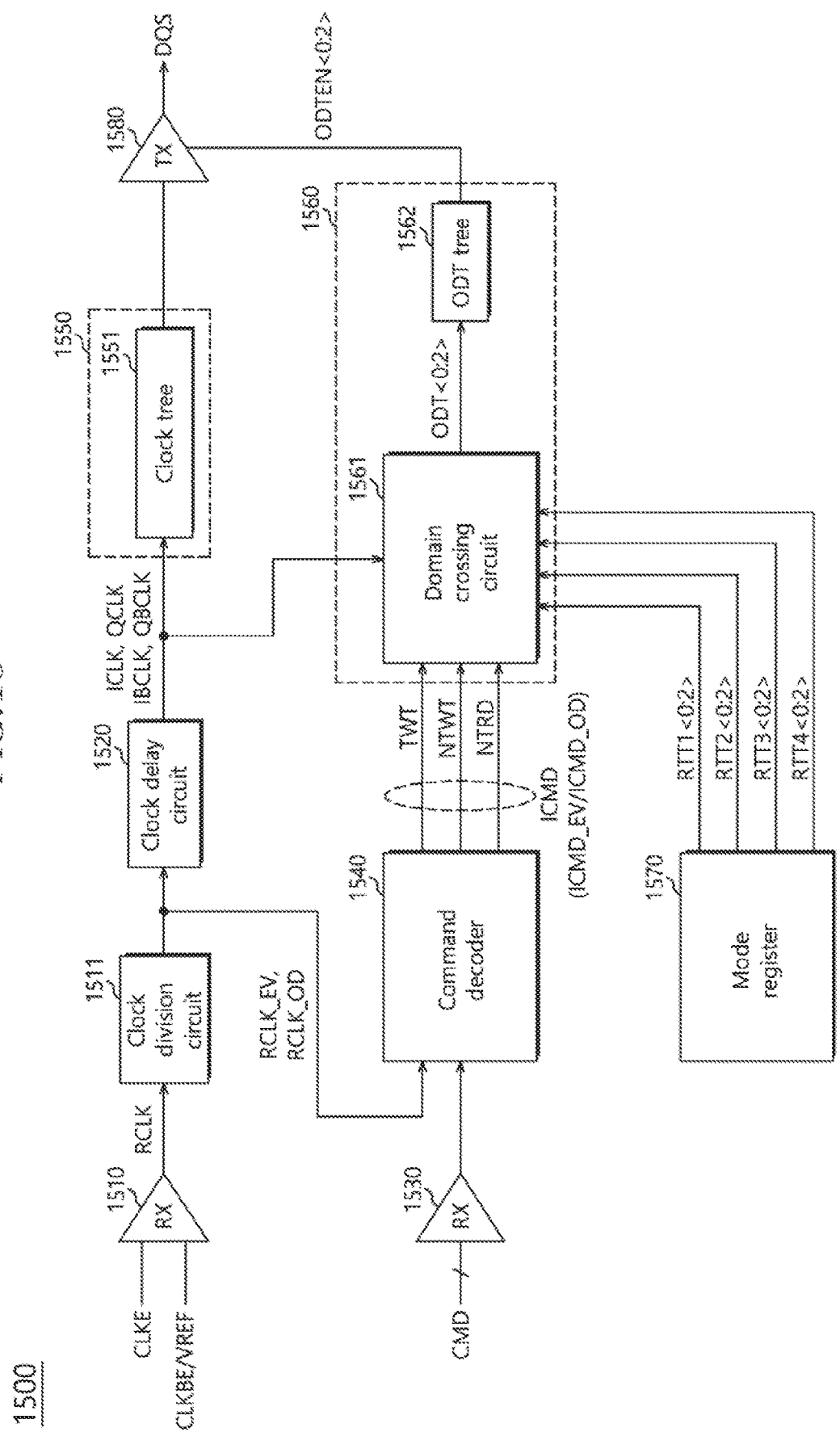
FIG. 15 is a diagram illustrating a configuration of a semiconductor apparatus according to various embodiments.

FIG. 15 is a diagram illustrating a configuration of a semiconductor apparatus 1500 according to various embodiments. In FIG. 15, the semiconductor apparatus 1500 may include a clock receiver (RX) 1510, a clock division circuit 1511, a clock delay circuit 1520, a command receiver (RX) 1530, a command decoder 1540, a clock path 1550, a command path 1560, a mode register 1570, and a transmitter (TX) 1580. The clock receiver 1510 may receive an external clock signal CLKE transmitted by an external apparatus. The external clock signal CLKE may be transmitted as a single-ended signal, and may be transmitted as a differential signal along with a complementary signal CLKBE. In one embodiment, the clock receiver 1510 may generate a reference clock signal RCLK by differentially amplifying the external clock signal CLKE or CLKBE transmitted as a differential signal. In one embodiment, the clock receiver 1510 may generate the reference clock signal RCLK by differentially amplifying the external clock signal CLKE, transmitted as a single-ended signal, along with a reference voltage VREF. The reference voltage VREF may have a voltage level corresponding to the middle of a range in which the external clock signal CLKE swings. The external clock signal CLKE and/or the reference clock signal RCLK may correspond to the clock signal CLK illustrated in FIG. 1.

The clock division circuit 1511 may generate an even reference clock signal RCLK_EV and an odd reference clock signal RCLK_OD by dividing the reference clock signal RCLK. For example, the clock division circuit 1511 may generate the even reference clock signal RCLK_EV and odd reference clock signal RCLK_OD having a frequency corresponding to half of the frequency of the reference clock signal RCLK. The even reference clock signal RCLK_EV may be synchronized with an even-numbered edge of the reference clock signal RCLK. The odd reference clock signal RCLK_OD may be synchronized with an odd-numbered edge of the reference clock signal RCLK. A phase difference between the even reference clock signal RCLK_EV and the odd reference clock signal RCLK_OD may be 180 degrees.

The clock delay circuit 1520 may compensate for a delay quantity of the external clock signal CLKE attributable to an internal circuit of the semiconductor apparatus 1500. The clock delay circuit 1520 may generate a delay-locked clock signal, synchronized with the external clock signal CLKE, by delaying at least one of the even reference clock signal RCLK_EV and the odd reference clock signal RCLK_OD. The clock delay circuit 1520 may include a delay-locked loop circuit for generating the delay-locked clock signal by delaying at least one of the even reference clock signal RCLK_EV and the odd reference clock signal RCLK_OD. The clock delay circuit 1520 may generate a first division clock signal ICLK, a second division clock signal QCLK, a third division clock signal IBCLK and a fourth division clock signal QBCLK from the delay-locked clock signal. A phase difference between the first to fourth division clock signals ICLK, QCLK, IBCLK, and QBCLK may be 90 degrees. The second division clock signal QCLK and the fourth division clock signal QBCLK may correspond to the first division clock signal QCLK and second division clock signal QBCLK illustrated in FIG. 1, respectively. Although not illustrated, the clock delay circuit 1510 may further include a duty cycle correction circuit. The duty cycle correction circuit may correct the duty ratio of the first to fourth division clock signals ICLK, QCLK, IBCLK, and QBCLK so that the first to fourth division clock signals ICLK, QCLK, IBCLK, and QBCLK have a duty ratio of 50%.

The command receiver 1530 may receive a command signal CMD transmitted by the external apparatus. The command signal CMD may include a plurality of signals. The command signal CMD may include various types of information so that the semiconductor apparatus 1500 can perform various operations. The command signal CMD may include various types of information by a combination of logic levels of the plurality of signals.

The command decoder 1540 may receive the even reference clock signal RCLK_EV, the odd reference clock signal RCLK_OD, and the command signal CMD. The command decoder 1540 may latch the command signal CMD based on one of the even reference clock signal RCLK_EV and the odd reference clock signal RCLK_OD, and may generate various internal command signals ICMD by decoding the latched command signal. The internal command signals ICMD may include an even internal-command signal ICMD_EV and an odd internal-command signal ICMD_OD. When the command signal CMD is latched in synchronization with the even reference clock signal RCLK_EV, the command decoder 1540 may generate the even internal-command signal ICMD_EV. When the command signal CMD is latched in synchronization with the odd reference clock signal RCLK_OD, the command decoder 1540 may generate the odd internal-command signal ICMD_OD. The internal command signal ICMD may include a plurality of signals capable of setting the transmitter 1580 to have a termination resistance value. For example, the internal command signal ICMD may include a target write signal TWT, a non-target write signal NTWT, and a non-target read signal NTRD. The target write signal TWT may include an even target write signal and an odd target write signal. The non-target write signal NTWT may include an even non-target write signal and an odd non-target write signal. The non-target read signal NTRD may include an even non-target read signal and an odd non-target read signal.

The target write signal TWT may be an internal command signal ICMD generated based on the command signal CMD when the semiconductor apparatus 1500 performs a write operation. The non-target write signal NTWT may be an internal command signal ICMD generated based on the command signal CMD when another semiconductor apparatus electrically coupled to a system performs a write operation along with the semiconductor apparatus 1500. The non-target write signal NTWT may be generated when the semiconductor apparatus 1500 performs a non-target write operation. The semiconductor apparatus 1500 may provide termination resistance for the write operation of another semiconductor apparatus. The non-target read signal NTRD may be an internal command signal ICMD generated based on the command signal CMD when another semiconductor apparatus electrically coupled a system performs a read operation along with the semiconductor apparatus 1500. The non-target read signal NTRD may be generated when the semiconductor apparatus 1500 performs a non-target read operation. The semiconductor apparatus 1500 may provide termination resistance for the read operation of another semiconductor apparatus.

The clock path 1550 may include a clock tree 1551. The first to fourth division clock signals ICLK, QCLK, IBCLK, and QBCLK generated by the clock delay circuit 1520 may be output to the transmitter 1580 via the clock tree 1551.

The internal command signal ICMD generated by the command decoder 1540 may be output to the transmitter 1580 via the command path 1560. The command path 1560 may include a domain crossing circuit 1561 and an on die termination (ODT) tree 1562. The internal command signal ICMD is a signal asynchronously delayed without being synchronized with a clock signal. Accordingly, the domain crossing circuit 1561 may generate a synchronized internal command signal by synchronizing the internal command signal ICMD with the second or fourth division clock signal QCLK or QBCLK. The domain crossing circuit 1561 may synchronize the even internal-command signal ICMD_EV with the second division clock signal QCLK, and may synchronize the odd internal-command signal ICMD_OD with the fourth division clock signal QBCLK. The domain crossing circuit 1561 may generate a synchronized target write signal by synchronizing the target write signal TWT with the second or fourth division clock signal QCLK or QBCLK, and may define the pulse width of the synchronized target write signal. The domain crossing circuit 1561 may generate a synchronized non-target write signal by synchronizing the non-target write signal NTWT with the second or fourth division clock signal QCLK or QBCLK, and may define the pulse width of the synchronized non-target write signal. The domain crossing circuit 1561 may generate a synchronized non-target read signal by synchronizing the non-target read signal NTRD with the second or fourth division clock signal QCLK or QBCLK, and may define the pulse width of the synchronized non-target read signal. The domain crossing circuit 1561 may receive a plurality of resistance codes. The plurality of resistance codes may be provided by the mode register 1570.

The mode register 1570 may store various types of information related to an operation of the semiconductor apparatus 1500. The mode register 1570 may store a first resistance code RTT1<0:2>, a second resistance code RTT2<0:2>, a third resistance code RTT3<0:2>, and a fourth resistance code RTT4<0:2>. The first resistance code RTT1<0:2> may include information related to a termination resistance value which may be set when the semiconductor apparatus 1500 does not perform any operation. The second resistance code RTT2<0:2> may include information related to a termination resistance value which may be set when the semiconductor apparatus 1500 performs a write operation. The third resistance code RTT3<0:2> may include information related to a termination resistance value which may be set when the semiconductor apparatus 1500 performs a non-target write operation. The fourth resistance code RTT4<0:2> may include information related to a termination resistance value which may be set when the semiconductor apparatus 1500 performs a non-target read operation. The mode register 1570 may output the first to fourth resistance codes RTT1<0:2>, RTT2<0:2>, RTT3<0:2>, and RTT4<0:2> to the domain crossing circuit 1561. Each of the first to fourth resistance codes RTT1<0:2>, RTT2<0:2>, RTT3<0:2>, and RTT4<0:2> has been illustrated as including three bits, but various embodiments are not limited thereto. Each of the first to fourth resistance codes RTT1<0:2>, RTT2<0:2>, RTT3<0:2>, and RTT4<0:2> may include more or fewer than three bits in other embodiments.

The domain crossing circuit 1561 may output one of the first to fourth resistance codes RTT1<0:2>, RTT2<0:2>, RTT3<0:2>, and RTT4<0:2> as an ODT signal ODT<0:2> based on the target write signal TWT, the non-target write signal NTWT and the non-target read signal NTRD. For example, when the target write signal TWT is enabled, the domain crossing circuit 1561 may output the second resistance code RTT2<0:2> as the ODT signal ODT<0:2>. When the non-target write signal NTWT is enabled, the domain crossing circuit 1561 may output the third resistance code RTT3<0:2> as the ODT signal ODT<0:2>. When the non-target read signal NTRD is enabled, the domain crossing circuit 1561 may output the fourth resistance code RTT4<0:2> as the ODT signal ODT<0:2>. When any of the target write signal TWT, the non-target write signal NTWT, and the non-target read signal NTRD is not enabled, the domain crossing circuit 1561 may output the first resistance code RTT1<0:2> as the ODT signal ODT<0:2>. Furthermore, the domain crossing circuit 1561 may define priority between the target write signal TWT, the non-target write signal NTWT, and the non-target read signal NTRD. When at least two of the target write signal TWT, the non-target write signal NTWT, and the non-target read signal NTRD are enabled together, the domain crossing circuit 1561 may enable a resistance code, corresponding to a signal having priority, to be output. For example, the target write signal TWT may have priority over the non-target write signal NTWT and the non-target read signal NTRD. The non-target write signal NTWT may have priority over the non-target read signal NTRD. When the target write signal TWT and at least one of the non-target write signal NTWT and the non-target read signal NTRD are enabled together, the domain crossing circuit 1561 may output the second resistance code RTT2<0:2> as the ODT signal ODT<0:2> based on the target write signal TWT having priority. The ODT signal ODT<0:2> may be delayed through the ODT tree 1562 and generated as a termination enable signal ODTEN<0:2>.

When the termination enable signal ODTEN<0:2> is received, the transmitter 1580 may be set to have a termination resistance value. The transmitter 1580 may include a plurality of resistance legs. The plurality of resistance legs may be set to have a given resistance value through the execution of a calibration operation, such as ZQ calibration. The termination enable signal ODTEN<0:2> may be set to determine the number of resistance legs that are turned on among the plurality of resistance legs so that the transmitter 1580 has a termination resistance value. In one embodiment, the transmitter 1580 may include a decoding circuit. The decoding circuit may decode the termination enable signal ODTEN<0:2>. The transmitter 1580 may include the decoding circuit so that a large number of resistance legs can be selected based on the termination enable signal ODTEN<0:2> having a small number of bits. The transmitter 1580 may output, to an external apparatus, a signal output by the clock tree 1551. The transmitter 1580 may output, to the external apparatus, the signal output by the clock tree 1551 as a data strobe signal DQS. The data strobe signal DQS may be output to the external apparatus in synchronization with data output by the semiconductor apparatus 1500. The data strobe signal DQS may be transmitted to the external apparatus through a bus.

A delay quantity attributable to the clock path 1550 may be easily reduced in a design aspect. In contrast, it is difficult to reduce a delay quantity attributable to the command path 1560 because the domain crossing circuit 1561 has to convert the internal command signal ICMD into a signal synchronized with a clock signal. Accordingly, a mismatch may occur between the time taken for the division clock signals ICLK, QCLK, IBCLK, or QBCLK to reach the transmitter 1580 through the clock path 1550 and the time taken for the internal command signal ICMD to reach the transmitter 1580 as the termination enable signal ODTEN<0:2> through the command path 1560. Furthermore, the domain crossing circuit 1561 needs to generate the termination enable signal ODTEN<0:2> having a given pulse width for the operation reliability of the semiconductor apparatus 1500. Accordingly, the domain crossing circuit 1561 may include the signal generation circuit 100 or 1400 illustrated in FIG. 1 or 14. In this case, the termination enable signal ODTEN<0:2> needs to be enabled before the semiconductor apparatus 1500 performs the target write operation, the non-target write operation and the non-target read operation, and needs to be disabled after the semiconductor apparatus 1500 completes the target write operation, the non-target write operation and the non-target read operation. For example, the termination enable signal ODTEN<0:2> may be enabled, by a time corresponding to two cycles of the external clock signal CLKE and/or the reference clock signal RCLK, earlier than timing in which the transmitter 1580 transmits the data strobe signal DQS. The ODT signal ODTEN may be disabled after a time corresponding to 1 cycle, 1.5 cycles, or 2 cycles of the external clock signal CLKE and/or the reference clock signal RCLK after the semiconductor apparatus 1500 completes the target write operation, the non-target write operation, and the non-target read operation. Accordingly, the pulse width control circuit 500 illustrated in FIG. 5 may be modified as illustrated in FIG. 16.

Figure 16:
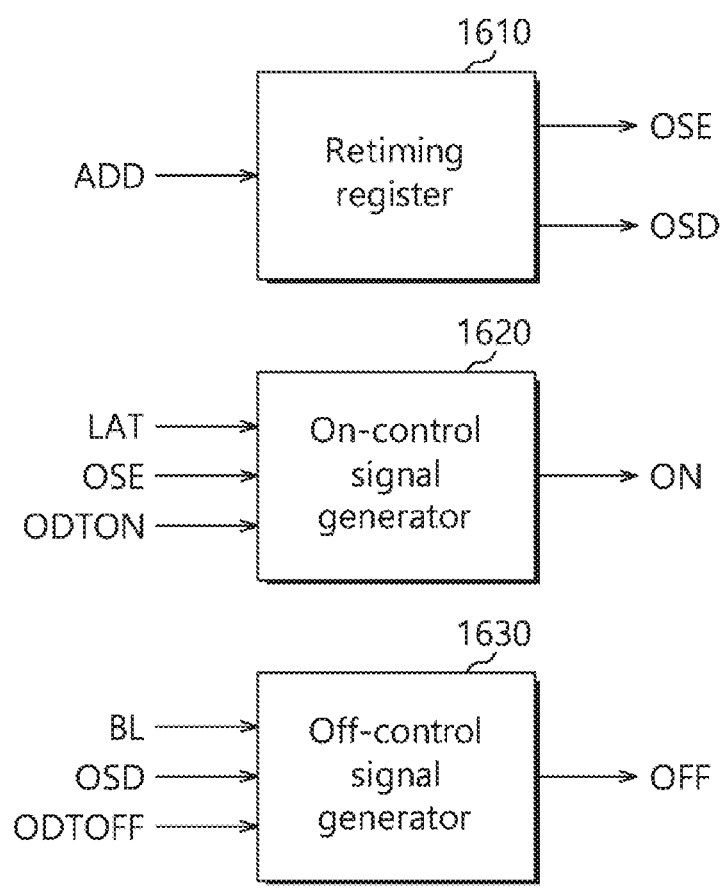
FIG. 16 is a diagram illustrating a configuration of a pulse width control circuit according to various embodiments.

FIG. 16 is a diagram illustrating a configuration of a pulse width control circuit 1600 according to various embodiments. Referring to FIG. 16, the pulse width control circuit 1600 may include a retiming register 1610, an on-control signal generator 1620 and an off-control signal generator 1630. The retiming register 1610 may be the same as the retiming register 510 illustrated in FIG. 5, and a redundant description thereof is omitted.

The on-control signal generator 1620 may receive the operation latency LAT, the on-offset signal OSE and an on-margin signal ODTON, and may generate the on-control signal ON. The on-margin signal ODTON may include information corresponding to a time margin in which the ODT signal ODTEN needs to be enabled prior to timing in which the transmitter 1580 outputs the data strobe signal DQS. The operation latency LAT, the on-offset signal OSE and the on-margin signal ODTON may be provided by the mode register 1570 illustrated in FIG. 15. The on-control signal generator 1620 may generate the on-control signal ON by performing an operation on the operation latency LAT, the on-offset signal OSE and the on-margin signal ODTON. For example, the on-control signal generator 1620 may generate the on-control signal ON by subtracting the on-offset signal OSE and the on-margin signal ODTON from the operation latency LAT. For example, when the operation latency LAT corresponds to 10, the on-offset signal OSE corresponds to 2, and the on-margin signal ODTON corresponds to 2, the on-control signal ON may correspond to 6. The first on-timing control circuit 211 illustrated in FIG. 2 may generate the even on-pulse signal ONA by delaying the first input signal INA by six cycles of the external clock signal CLKE and/or the reference clock signal RCLK (i.e., by three cycles of the second division clock signal QCLK) in response to the on-control signal ON.

The off-control signal generator 1630 may receive the operation section information BL, the off-offset signal OSD and an off-margin signal ODTOFF, and may generate the off-control signal OFF. The off-margin signal ODTOFF may include information corresponding to a time margin in which the ODT signal ODTEN needs to be disabled after the transmitter 1580 completes the transmission of the data strobe signal DQS. The operation section information BL, the off-offset signal OSD and the off-margin signal ODTOFF may be provided by the mode register 1570 illustrated in FIG. 15. The off-control signal generator 1630 may generate the off-control signal OFF by performing an operation on the operation section information BL, the off-offset signal OSD and the off-margin signal ODTOFF. For example, the off-control signal generator 1630 may generate the off-control signal OFF by subtracting the off-offset signal OSD from the operation section information BL and adding the off-margin signal ODTOFF to a subtraction result. For example, when the operation section information BL corresponds to 16, the off-offset signal OSD corresponds to 2, and the off-margin signal ODTOFF corresponds to 2, the off-control signal OFF may correspond to 16. The first off-timing control circuit 212 illustrated in FIG. 2 may generate the even off-pulse signal OFFA by delaying the even on-pulse signal ONA by 16 cycles of the external clock signal CLKE and/or the reference clock signal RCLK (i.e., by 8 cycles of the first division clock signal QCLK) in response to the off-control signal OFF.

Figure 17:
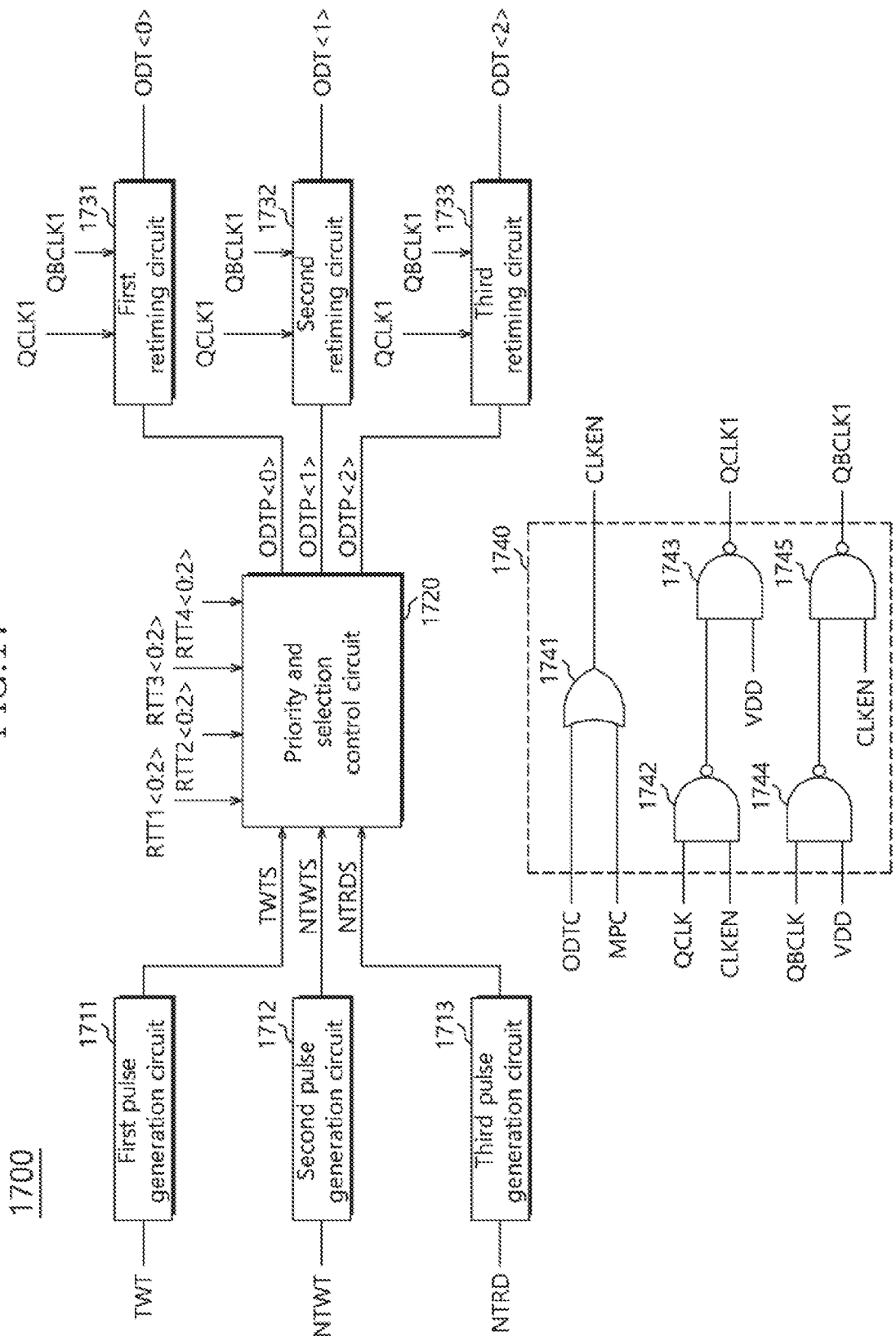
FIG. 17 is a diagram illustrating a configuration of a domain crossing circuit according to various embodiments.

FIG. 17 is a diagram illustrating a configuration of a domain crossing circuit 1700 according to various embodiments. The domain crossing circuit 1700 may be applied as the domain crossing circuit 1561 illustrated in FIG. 15. Referring to FIG. 17, the domain crossing circuit 1700 may include a first pulse generation circuit 1711, a second pulse generation circuit 1712, a third pulse generation circuit 1713, a priority and selection control circuit 1720, a first retiming circuit 1731, a second retiming circuit 1732, and a third retiming circuit 1733. Each of the first to third pulse generation circuits 1711, 1712, and 1713 may be an element, including the first synchronization signal generation circuit 110, the second synchronization signal generation circuit 120, and the gating circuit 140 illustrated in FIG. 1 and the pulse width control circuit 1600 illustrated in FIG. 16. The first pulse generation circuit 1711 may receive the target write signal TWT and generate a synchronized target write signal TWTS. The second pulse generation circuit 1712 may receive the non-target write signal NTWT and generate a synchronized non-target write signal NTWTS. The third pulse generation circuit 1713 may receive the non-target read signal NTRD and generate a synchronized non-target read signal NTRDS. At least some of the synchronized target write signal TWTS, the synchronized non-target write signal NTWTS and the synchronized non-target read signal NTRDS may have the same pulse width. In one embodiment, the synchronized target write signal TWTS, the synchronized non-target write signal NTWTS and the synchronized non-target read signal NTRDS may have different pulse widths.

The priority and selection control circuit 1720 may receive the synchronized target write signal TWTS, the synchronized non-target write signal NTWTS and the synchronized non-target read signal NTRDS, and may receive the first to fourth resistance codes RTT1<0:2>, RTT2<0:2>, RTT3<0:2>, and RTT4<0:2> from the mode register 1570 illustrated in FIG. 15. The priority and selection control circuit 1720 may select only any one of the synchronized target write signal TWTS, the synchronized non-target write signal NTWTS and the synchronized non-target read signal NTRDS based on priority in the state in which at least two of the synchronized target write signal TWTS, the synchronized non-target write signal NTWTS and the synchronized non-target read signal NTRDS have been enabled together. When the synchronized target write signal TWTS is enabled, the priority and selection control circuit 1720 may output the second resistance code RTT2<0:2> as a preliminary ODT signal ODTP<0:2> in the section in which the synchronized target write signal TWTS has been enabled. When the synchronized non-target write signal NTWTS is enabled, the priority and selection control circuit 1720 may output the third resistance code RTT3<0:2> as the preliminary ODT signal ODTP<0:2> in the section in which the synchronized non-target write signal NTWTS has been enabled. When the synchronized non-target read signal NTRDS is enabled, the priority and selection control circuit 1720 may output the fourth resistance code RTT4<0:2> as the preliminary ODT signal ODTP<0:2> in the section in which the synchronized non-target read signal NTRDS has been enabled. The priority and selection control circuit 1720 may output the first resistance code RTT1<0:2> as the preliminary ODT signal ODTP<0:2> in the state in which all the synchronized target write signal TWTS, the synchronized non-target write signal NTWT and the synchronized non-target read signal NTRD have been disabled. For example, a case where after the synchronized non-target write signal NTWTS is enabled, the synchronized target write signal TWTS is enabled is assumed. The priority and selection control circuit 1720 may output the first resistance code RTT1<0:2> as the preliminary ODT signal ODTP<0:2>, may stop the output of the first resistance code RTT1<0:2> when the synchronized non-target write signal NTWTS is enabled, and may output the third resistance code RTT3<0:2> as the preliminary ODT signal ODTP<0:2>. Thereafter, when the synchronized target write signal TWTS is enabled, the priority and selection control circuit 1720 may stop the output of the third resistance code RTT3<0:2> and output the second resistance code RTT2<0:2> as the preliminary ODT signal ODTP<0:2>. When the synchronized target write signal TWTS is disabled, the priority and selection control circuit 1720 may stop the output of the second resistance code RTT2<0:2> and output the first resistance code RTT1<0:2> as the preliminary ODT signal ODTP<0:2>.

Each of the first to third retiming circuits 1731, 1732, and 1733 may include any one of the retiming circuits 800, 900, and 1000 illustrated in FIGS. 8 to 10. The first to third retiming circuits 1731, 1732, and 1733 may receive a first gating clock signal QCLK1 and a second gating clock signal QBCLK1. The first gating clock signal QCLK1 may be substituted with the first division clock signal QCLK input to the retiming circuit 800, 900, or 1000. The second gating clock signal QBCLK1 may be substituted with the second division clock signal QBCLK input to the retiming circuit 800, 900, or 1000. The first gating clock signal QCLK1 may have substantially the same phase and frequency as the second division clock signal QCLK illustrated in FIG. 15. The second gating clock signal QBCLK1 may have substantially the same phase and frequency as the fourth division clock signal QBCLK illustrated in FIG. 15. The first retiming circuit 1731 may generate the ODT signal ODT<0> by retiming the preliminary ODT signal ODTP<0> based on the first and second gating clock signals QCLK1 and QBCLK1. The second retiming circuit 1732 may generate the ODT signal ODT<1> by retiming the preliminary ODT signal ODTP<1> based on the first and second gating clock signals QCLK1 and QBCLK1. The third retiming circuit 1733 may generate the ODT signal ODT<2> by retiming the preliminary ODT signal ODTP<2> based on the first and second gating clock signals QCLK1 and QBCLK1. The priority and selection control circuit 1720 may include many logic gating elements because it has to output one of the first to fourth resistance codes RTT1<0:2>, RTT2<0:2>, RTT3<0:2>, and RTT4<0:2> by determining priority of the target write signal TWT, the non-target write signal NTWT and the non-target read signal NTRD. A delay may occur in a circuit, including many logic gating elements, depending on a process variation and degradation. Furthermore, an asynchronized delay may occur in the priority and selection control circuit 1720 because it does not operate in synchronization with a clock signal. In various embodiments, the first to third retiming circuits 1731, 1732, and 1733 have a structure of retiming a signal output by the priority and selection control circuit 1720. Accordingly, the first to third retiming circuits 1731, 1732, and 1733 may output the ODT signal ODT<0:2> by compensating for a changed pulse width or phase of the preliminary ODT signal ODTP<0:2> attributable to the priority and selection control circuit 1720.

The domain crossing circuit 1700 may further include a clock gating circuit 1740. The clock gating circuit 1740 may generate a clock enable signal CLKEN based on an on-die termination command signal ODTC. The clock gating circuit 1740 may enable the clock enable signal CLKEN when the on-die termination command signal ODTC is enabled. The on-die termination command signal ODTC may be a signal enabled when any one of the target write signal TWT, the non-target write signal NTWT, and the non-target read signal NTRD is enabled. The clock gating circuit 1740 may further receive a multi-purpose command signal MPC, and may generate the clock enable signal CLKEN based on the on-die termination command signal ODTC and the multi-purpose command signal MPC. The clock gating circuit 1740 may enable the clock enable signal CLKEN when at least one of the on-die termination command signal ODTC and the multi-purpose command signal MPC is enabled. The multi-purpose command signal MPC may be one of the internal command signals ICMD illustrated in FIG. 15, and may be generated from a command signal CMD which may be input to change a value of the first resistance code RTT1<0:2>. When the multi-purpose command signal MPC is received, the clock gating circuit 1740 may enable the clock enable signal CLKEN so that the ODT signal ODT<0:2> is output based on the changed first resistance code RTT1<0:2>. Accordingly, a logic value of the ODT signal ODT<0:2> may be updated from a first resistance code RTT<0:2> prior to a change to a first resistance code RTT1<0:2> after a change.

The clock gating circuit 1740 may output the second division clock signal QCLK as the first gating clock signal QCLK1 and output the fourth division clock signal QBCLK as the second gating clock signal QBCLK1, based on the clock enable signal CLKEN. When the clock enable signal CLKEN is enabled, the clock gating circuit 1740 may output the second division clock signal QCLK as the first gating clock signal QCLK1 and output the fourth division clock signal QBCLK as the second gating clock signal QBCLK1.

The clock gating circuit 1740 may include an OR gate 1741, a first NAND gate 1742, a second NAND gate 1743, a third NAND gate 1744, and a fourth NAND gate 1745. The OR gate 1741 may receive the on-die termination command signal ODTC and the multi-purpose command signal MPC, and may output the clock enable signal CLKEN. The first NAND gate 1742 may receive the second division clock signal QCLK and the clock enable signal CLKEN. The second NAND gate 1743 may receive the output of the first NAND gate 1742 and a power supply voltage VDD and output the first gating clock signal QCLK1. The power supply voltage VDD may have a voltage level which may be determined as a logic high level. The third NAND gate 1744 may receive the fourth division clock signal QBCLK and the power supply voltage VDD. The fourth NAND gate 1745 may receive the output of the third NAND gate 1744 and the clock enable signal CLKEN, and may output the second gating clock signal QBCLK1.

Figure 18:
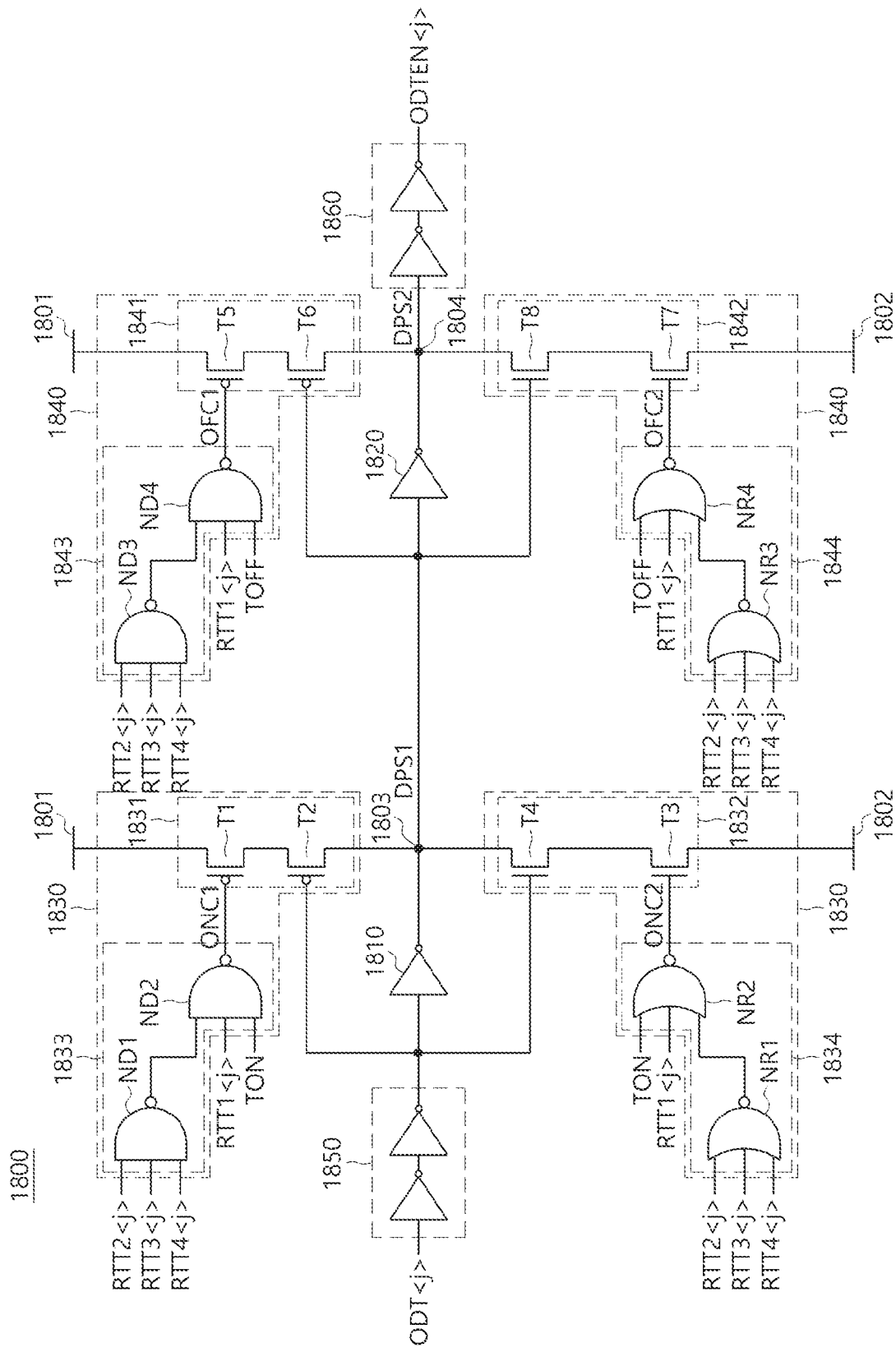
FIG. 18 is a diagram illustrating a configuration of a signal driver according to various embodiments.

FIG. 18 is a diagram illustrating a configuration of a signal driver 1800 according to an embodiment. Referring to FIG. 18, the signal driver 1800 may receive an input pulse signal ODT<j> and generate an output pulse signal ODTEN<j>. The signal driver 1800 may generate the output pulse signal ODTEN<j> by delaying the input pulse signal ODT<j>. The input pulse signal ODT<j> may be a logic high pulse signal which is shifted and/or disabled from a logic high level to a logic low level after being shifted and/or enabled from a logic low level to a logic high level, or may be a logic low pulse signal which is shifted and/or disabled from a logic low level to a logic high level after being shifted and/or enabled from a logic high level to a logic low level. The signal driver 1800 may determine a logic level of the input pulse signal ODT<j>, and may independently control enabling timing and disabling timing of the output pulse signal ODTEN<j> based on the logic level of the input pulse signal ODT<j>. The signal driver 1800 may control the pulse width of the output pulse signal ODTEN<j> by independently controlling the enabling timing and disabling timing of the output pulse signal ODTEN<j>.

Referring back to FIG. 15, the pulse width and phase of the on-die termination signals ODT<0:2> are controlled through the domain crossing circuit 1561, but the on-die termination signals ODT<0:2> may be delayed again through the ODT tree 1562. The ODT tree 1562 may include multiple gating circuits, and thus the pulse width and phase of the on-die termination enable signals ODTEN<0:2> output by the ODT tree 1562 may be changed again. Accordingly, the ODT tree 1562 may need to control the pulse width and phase of the on-die termination enable signals ODTEN<0:2>. In order to control the pulse width and phase of the on-die termination enable signals ODTEN<0:2>, the ODT tree 1562 may adopt the configuration of the signal driver 1800 illustrated in FIG. 18. The input pulse signal ODT<j> may correspond to a j-th bit of the bits of the on-die termination signals ODT<0:2>. The output pulse signal ODTEN<j> may correspond to a j-th bit of the bits of the on-die termination enable signals ODTEN<0:2>. In this case, j may be an integer between 1 and the number of bits of the on-die termination signals ODT<0:2>. The ODT tree 1562 may include the same number of signal drivers as the numbers of bits of the on-die termination signal ODTEN<0:2>. For example, if the numbers of bits of the on-die termination signals ODT<0:2> is 3, the ODT tree 1562 may include three signal drivers. Each of the three signal drivers may generate first to third bits ODTEN<0:2> of the on-die termination enable signal by delaying the first to third bits ODT<0:2> of the on-die termination signal.

The signal driver 1800 may include a first driver 1810, a second driver 1820, an on-timing control circuit 1830, and an off-timing control circuit 1840. The first driver 1810 may receive the input pulse signal ODT<j>, and may generate a first driving pulse signal DPS1 by inverting and driving the input pulse signal ODT<j>. The first driver 1810 may be configured with an odd number of inverters. The second driver 1820 may receive the first driving pulse signal DPS1, and may generate a second driving pulse signal DPS2 by inverting and driving the first driving pulse signal DPS1. The second driver 1820 may be configured with an odd number of inverters. The number of inverters included in the second driver 1820 may be the same as or different from the number of inverters included in the first driver 1810. The second driving pulse signal DPS2 may have the same logic level as the first driving pulse signal DPS1. The second driving pulse signal DPS2 may be provided as the output pulse signal ODTEN<j>.

The on-timing control circuit 1830 may control the pulse width of the first driving pulse signal DPS1 by pull-up or pull-down driving the first driving pulse signal DPS1 based on a first on-timing control signal ONC1, a second on-timing control signal ONC2, and the input pulse signal ODT<j>. The on-timing control circuit 1830 may pull-up drive the first driving pulse signal DPS1 based on the first on-timing control signal ONC1 and the input pulse signal ODT<j>, and may pull-down drive the first driving pulse signal DPS1 based on the second on-timing control signal ONC2 and the input pulse signal ODT<j>. The first and second on-timing control signals ONC1 and ONC2 may include information on a logic level of the input pulse signal ODT<j> and information on whether the pulse width of the output pulse signal ODTEN<j> is controlled. The information on the logic level of the input pulse signal ODT<j> may be information on whether the input pulse signal ODT<j> is a logic high pulse signal or a logic low pulse signal. The information on whether the pulse width of the output pulse signal ODTEN<j> is controlled may be information on whether enabling timing of the output pulse signal ODTEN<j> is controlled. Whether the enabling timing of the output pulse signal ODTEN<j> is controlled may be determined based on whether an on-timing enable signal TON is enabled. The on-timing enable signal TON may be a control signal input from the outside of the signal driver 1800 in order to indicate controlling the enabling timing of the output pulse signal ODTEN<j>. When the on-timing enable signal TON is enabled, one of the first and second on-timing control signals ONC1 and ONC2 may be enabled based on a logic level of the input pulse signal ODT<j>.

When the input pulse signal ODT<j> is a logic low pulse signal and the on-timing enable signal TON is enabled, the on-timing control circuit 1830 may pull-up drive the first driving pulse signal DPS1 by enabling the first on-timing control signal ONC1. When the input pulse signal ODT<j> is a logic low pulse signal, the first driving pulse signal DPS1 is a logic high pulse signal. Accordingly, the on-timing control circuit 1830 may control the phase and slope of a rising edge of the first driving pulse signal DPS1 and the enabling timing of the output pulse signal ODTEN<j> by pull-up driving the first driving pulse signal DPS1. When the input pulse signal ODT<j> is a logic high pulse signal and the on-timing enable signal TON is enabled, the on-timing control circuit 1830 may pull-down drive the first driving pulse signal DPS1 by enabling the second on-timing control signal ONC2. When the input pulse signal ODT<j> is a logic high pulse signal, the first driving pulse signal DPS1 is a logic low pulse signal. Accordingly, the on-timing control circuit 1830 may control the phase and slope of a falling edge of the first driving pulse signal DPS1 and the enabling timing of the output pulse signal ODTEN<j> by pull-down driving the first driving pulse signal DPS1.

The off-timing control circuit 1840 may control the pulse width of the second driving pulse signal DPS2 by pull-up or pull-down driving the second driving pulse signal DPS2 based on a first off-timing control signal OFC1, a second off-timing control signal OFC2, and the first driving pulse signal DPS1. The off-timing control circuit 1840 may pull-up drive the second driving pulse signal DPS2 based on the first off-timing control signal OFC1 and the first driving pulse signal DPS1, and may pull-down drive the second driving pulse signal DPS2 based on the second off-timing control signal OFC2 and the first driving pulse signal DPS1. Each of the first and second off-timing control signals OFC1 and OFC2 may include information on a logic level of the input pulse signal ODT<j> and information on whether disabling timing of the output pulse signal ODTEN<j> is controlled. The information on whether the disabling timing of the output pulse signal ODTEN<j> is controlled may be determined based on whether an off-timing enable signal TOFF is enabled. The off-timing enable signal TOFF may be a control signal input from the outside of the signal driver 1800 in order to indicate controlling the disabling timing of the output pulse signal ODTEN<j>. When the off-timing enable signal TOFF is enabled, one of the first and second off-timing control signals OFC1 and OFC2 may be enabled based on a logic level of the input pulse signal ODT<j>.

When the input pulse signal ODT<j> is a logic low pulse signal and the off-timing enable signal TOFF is enabled, the off-timing control circuit 1840 may pull-up drive the second driving pulse signal DPS2 by enabling the first off-timing control signal OFC1. When the input pulse signal ODT<j> is a logic low pulse signal, the second driving pulse signal DPS2 is also a logic low pulse signal. Accordingly, the off-timing control circuit 1840 may control the phase and slope of a rising edge of the second driving pulse signal DPS2 and the disabling timing of the output pulse signal ODTEN<j> by pull-up driving the second driving pulse signal DPS2. When the input pulse signal ODT<j> is a logic high pulse signal and the off-timing enable signal TOFF is enabled, the off-timing control circuit 1840 may pull down drive the second driving pulse signal DPS2 by enabling the second off-timing control signal OFC2. When the input pulse signal ODT<j> is a logic high pulse signal, the second driving pulse signal DPS2 is also a logic high pulse signal. Accordingly, the off-timing control circuit 1840 may control the phase and slope of a falling edge of the second driving pulse signal DPS2 and the disabling timing of the output pulse signal ODTEN<j> by pull-down driving the second driving pulse signal DPS2.

The signal driver 1800 may further include a third driver 1850 and a fourth driver 1860. The third driver 1850 may receive the input pulse signal ODT<j>. The third driver 1850 may non-inversion-drive the input pulse signal ODT<j> and provide the non-inversion-driven signal to the first driver 1810 and the on-timing control circuit 1830. The third driver 1850 may include an even number of inverters. The fourth driver 1860 may receive the second driving pulse signal DPS2. The fourth driver 1860 may non-inversion-drive the second driving pulse signal DPS2 and provide the non-inversion-driven signal as the output pulse signal ODTEN<j>. The fourth driver 1860 may include an even number of inverters. The number of inverters included in the fourth driver 1860 may be the same as or different from the number of inverters included in the third driver 1850.

The on-timing control circuit 1830 may include a first pull-up driver 1831 and a first pull-down driver 1832. The first pull-up driver 1831 may pull-up drive the first driving pulse signal DPS1 based on the first on-timing control signal ONC1 and the input pulse signal ODT<j>. When the first on-timing control signal ONC1 is enabled to a logic low level and the input pulse signal ODT<j> has a logic low level, the first pull-up driver 1831 may pull-up drive the first driving pulse signal DPS1. The first pull-down driver 1832 may pull-down drive the first driving pulse signal DPS1 based on the second on-timing control signal ONC2 and the input pulse signal ODT<j>. When the second on-timing control signal ONC2 is enabled to a logic high level and the input pulse signal ODT<j> has a logic high level, the first pull-down driver 1832 may pull-down drive the first driving pulse signal DPS1.

The on-timing control circuit 1830 may further include a first on-timing control signal generator 1833 and a second on-timing control signal generator 1834. When the input pulse signal ODT<j> is a logic low pulse signal and the on-timing enable signal TON is enabled, the first on-timing control signal generator 1833 may enable the first on-timing control signal ONC1. When the input pulse signal ODT<j> is a logic high pulse signal and the on-timing enable signal TON is enabled, the second on-timing control signal generator 1834 may enable the second on-timing control signal ONC2.

Referring to FIGS. 15 and 18 together, if the signal driver 1800 is applied to the ODT tree 1562, a logic level of the input pulse signal ODT<j> may be determined based on the first to fourth resistance codes RTT1<0:2>, RTT2<0:2>, RTT3<0:2>, and RTT4<0:2>. The first on-timing control signal generator 1833 may determine a logic level of the input pulse signal ODT<j> based on at least a logic value of a first code and a logic value of a second code. The first code may be any one of the bits of the first resistance codes RTT1<0:2> for setting a termination resistance value when the semiconductor apparatus 1500 performs a park operation. The second code may be any one of the bits of the second to fourth resistance codes RTT2<0:2>, RTT3<0:2>, and RTT4<0:2> for setting a termination resistance value when the semiconductor apparatus 1500 performs a write operation, a non-target write operation, and a non-target read operation. If a logic value of the first resistance codes RTT<0:2> is 0 and a logic value of at least one of the second to fourth resistance codes RTT2<0:2>, RTT3<0:2>, and RTT4<0:2> is 1, when an operation of the semiconductor apparatus 1500 switches from the park operation to at least one of the write operation, the non-target write operation, and the non-target read operation, the first and second on-timing control signal generators 1833 and 1834 may determine that the input pulse signal ODT<j> is a logic high pulse signal, based on logic values of the first and second codes. In contrast, if a logic value of the first resistance codes RTT1<0:2> is 1 and a logic value of at least one of the second to fourth resistance codes RTT2<0:2>, RTT3<0:2>, and RTT4<0:2> is 0, the first and second on-timing control signal generators 1833 and 1834 may determine that the input pulse signal ODT<j> is a logic low pulse signal, based on logic values of the first and second codes. If the signal driver 1800 is applied to the ODT tree 1562, the on-timing control circuit 1830 may be modified to control enabling timing of the first driving pulse signal DPS1 based on a logic value of the first code, a logic value of the second code, the on-timing enable signal TON, and the input pulse signal ODT<j>. When a logic value of the first code is different from a logic value of the second code and the on-timing enable signal TON is enabled, the on-timing control circuit 1830 may control enabling timing of the first driving pulse signal DPS1 based on the input pulse signal ODT<j>.

The off-timing control circuit 1840 may include a second pull-up driver 1841 and a second pull-down driver 1842. The second pull-up driver 1841 may pull-up drive the second driving pulse signal DPS2 based on the first off-timing control signal OFC1 and the first driving pulse signal DPS1. When the first off-timing control signal OFC1 is enabled to a logic low level and the first driving pulse signal DPS1 has a logic low level, the second pull-up driver 1841 may pull-up drive the second driving pulse signal DPS2. The second pull-down driver 1842 may pull-down drive the second driving pulse signal DPS2 based on the second off-timing control signal OFC2 and the first driving pulse signal DPS1. When the second off-timing control signal OFC2 is enabled to a logic high level and the first driving pulse signal DPS1 has a logic high level, the second pull-down driver 1842 may pull-down drive the second driving pulse signal DPS2.

The off-timing control circuit 1840 may further include a first off-timing control signal generator 1843 and a second off-timing control signal generator 1844. When the input pulse signal ODT<j> is a logic low pulse signal and the off-timing enable signal TOFF is enabled, the first off-timing control signal generator 1843 may enable the first off-timing control signal OFC1. When the input pulse signal ODT<j> is a logic high pulse signal and the off-timing enable signal TOFF is enabled, the second off-timing control signal generator 1844 may enable the second off-timing control signal OFC2.

If the signal driver 1800 is applied to the ODT tree 1562, the first off-timing control signal generator 1843 may determine a logic level of the input pulse signal ODT<j> based on a logic value of the first code and a logic value of the second code. If a logic value of the first resistance codes RTT1<0:2> is 0 and a logic value of at least one of the second to fourth resistance codes RTT2<0:2>, RTT3<0:2>, and RTT4<0:2> is 1, when an operation of the semiconductor apparatus 1500 switches from the park operation to at least one of the write operation, the non-target write operation, and the non-target read operation, the first and second off-timing control signal generators 1843 and 1844 may determine that the input pulse signal ODT<j> is a logic high pulse signal. In contrast, if a logic value of the first resistance codes RTT1<0:2> is 1 and a logic value of at least one of the second to fourth resistance codes RTT2<0:2>, RTT3<0:2>, and RTT4<0:2> is 0, the first and second off-timing control signals generators 1843 and 1844 may determine that the input pulse signal ODT<j> is a logic low pulse signal. If the signal driver 1800 is applied to the ODT tree 1562, the off-timing control circuit 1840 may be modified to control disabling timing of the second driving pulse signal DPS2 based on a logic value of the first code, a logic value of the second code, the off-timing enable signal TOFF, and the first driving pulse signal DPS1. If a logic value of the first code is different from a logic value of the second code and the off-timing enable signal TOFF is enabled, the off-timing control circuit 1840 may control disabling timing of the second driving pulse signal DPS2 based on the first driving pulse signal DPS1.

The first pull-up driver 1831 may include a first transistor T1 and a second transistor T2. Each of the first and second transistors T1 and T2 may be a P-channel MOS transistor. The first transistor T1 may receive the first on-timing control signal ONC1 through a gate thereof, and may have a source coupled to a power supply voltage terminal 1801. The second transistor T2 may receive the input pulse signal ODT<j> through a gate thereof, and may have a source coupled to a drain of the first transistor T1. The second transistor T2 may have a drain coupled to a node 1803 from which the first driving pulse signal DPS1 is output. The first pull-down driver 1832 may include a third transistor T3 and a fourth transistor T4. Each of the third and fourth transistors T3 and T4 may be an N-channel MOS transistor. The third transistor T3 may receive the second on-timing control signal ONC2 through a gate thereof, and may have a source coupled to a ground voltage terminal 1802. The fourth transistor T4 may receive the input pulse signal ODT<j> through a gate thereof, and may have a drain coupled to the node 1803 from which the first driving pulse signal DPS1 is output. The fourth transistor T4 may have a source coupled to a drain of the third transistor T3.

The first on-timing control signal generator 1833 may include a first NAND gate ND1 and a second NAND gate ND2. The first NAND gate ND1 may receive a j-th bit RTT2<j> of the second resistance code, a j-th bit RTT3<j> of the third resistance code, and a j-th bit RTT4<j> of the fourth resistance code. When any one of the j-th bits RTT2<j>, RTT3<j>, and RTT4<j> of the second to fourth resistance codes has a logic low level, the first NAND gate ND1 may generate an output having a logic high level. The second NAND gate ND2 may receive the output of the first NAND gate ND1, the j-th bit RTT1<j> of the first resistance code, and the on-timing enable signal TON, and may generate the first on-timing control signal ONC1. When the output of the first NAND gate ND1 has a logic high level, the j-th bit RTT1<j> of the first resistance code has a logic high level, and the on-timing enable signal TON is enabled to a logic high level, the second NAND gate ND2 may enable the first on-timing control signal ONC1 to a logic low level. The second on-timing control signal generator 1834 may include a first NOR gate NR1 and a second NOR gate NR2. The first NOR gate NR1 may receive the j-th bit RTT2<j> of the second resistance code, the j-th bit RTT3<j> of the third resistance code, and the j-th bit RTT4<j> of the fourth resistance code. When any one of the j-th bits RTT2<j>, RTT3<j>, and RTT4<j> of the second to fourth resistance codes has a logic high level, the first NOR gate NR1 may generate an output having a logic low level. The second NOR gate NR2 may receive the output of the first NOR gate NR1, the j-th bit RTT1<j> of the first resistance code, and an inverted signal of the on-timing enable signal TON, and may generate the first on-timing control signal ONC1. When the output of the first NOR gate NR1 has a logic low level, the j-th bit RTT1<j> of the first resistance code has a logic low level, and the on-timing enable signal TON is enabled to a logic high level, the second NOR gate NR2 may enable the second on-timing control signal ONC2 to a logic high level.

The second pull-up driver 1841 may include a fifth transistor T5 and a sixth transistor T6. Each of the fifth and sixth transistors T5 and T6 may be a P-channel MOS transistor. The fifth transistor T5 may receive the first off-timing control signal OFC1 through a gate thereof, and may have a source coupled to the power supply voltage terminal 1801. The sixth transistor T6 may receive the first driving pulse signal DPS1 through a gate thereof, and may have a source coupled to a drain of the fifth transistor T5. The sixth transistor T6 may have a drain coupled to a node 1804 from which the second driving pulse signal DPS2 is output. The second pull-down driver 1842 may include a seventh transistor T7 and an eighth transistor T8. Each of the seventh and eighth transistors T7 and T8 may be an N-channel MOS transistor. The seventh transistor T7 may receive the second off-timing control signal OFC2 through a gate thereof, and may have a source coupled to the ground voltage terminal 1802. The eighth transistor T8 may receive the first driving pulse signal DPS1 through a gate thereof, and may have a drain coupled to the node 1804 from which the second driving pulse signal DPS2 is output. The eighth transistor T8 may have a source coupled to a drain of the seventh transistor T7.

The first off-timing control signal generator 1843 may include a third NAND gate ND3 and a fourth NAND gate ND4. The third NAND gate ND3 may receive the j-th bit RTT2<j> of the second resistance code, the j-th bit RTT3<j> of the third resistance code, and the j-th bit RTT4<j> of the fourth resistance code. When any one of the j-th bits RTT2<j>, RTT3<j>, and RTT4<j> of the second to fourth resistance codes has a logic low level, the third NAND gate ND3 may generate an output having a logic high level. The fourth NAND gate ND4 may receive the output of the third NAND gate ND3, the j-th bit RTT1<j> of the first resistance code, and the off-timing enable signal TOFF, and may generate the first off-timing control signal OFC1. When the output of the third NAND gate ND3 has a logic high level, the j-th bit RTT1<j> of the first resistance code has a logic high level, and the off-timing enable signal TOFF is enabled to a logic high level, the fourth NAND gate ND4 may enable the first off-timing control signal OFC1 to a logic low level. The second off-timing control signal generator 1844 may include a third NOR gate NR3 and a fourth NOR gate NR4. The third NOR gate NR3 may receive the j-th bit RTT2<j> of the second resistance code, the j-th bit RTT3<j> of the third resistance code, and the j-th bit RTT4<j> of the fourth resistance code. When any one of the j-th bits RTT2<j>, RTT3<j>, and RTT4<j> of the second to fourth resistance codes has a logic high level, the third NOR gate NR3 may generate an output having a logic low level. The fourth NOR gate NR4 may receive the output of the third NOR gate NR3, the j-th bit RTT1<j> of the first resistance code, and an inverted signal of the off-timing enable signal TOFF, and may generate the second off-timing control signal OFC2. When the output of the third NOR gate NR3 has a logic low level, the j-th bit RTT1<j> of the first resistance code has a logic low level, and the off-timing enable signal TOFF is enabled to a logic high level, the fourth NOR gate NR4 may enable the second off-timing control signal OFC2 to a logic high level.

Figure 19A:
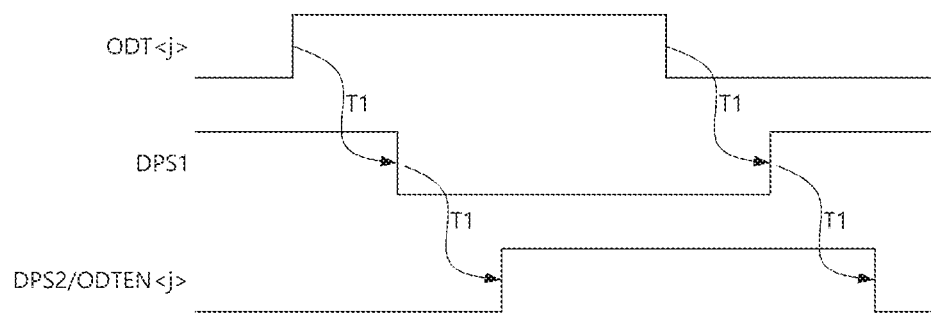
FIGS. 19A to 19E are timing diagrams illustrating an operation of a signal driver according to various embodiments.

FIGS. 19A to 19E are timing diagrams illustrating an operation of the signal driver 1800 according to an embodiment. An operation of the signal driver 1800 according to an embodiment is described below with reference to FIGS. 15, 18, and 19A to 19E. In the state in which the on-timing enable signal TON and the off-timing enable signal TOFF have been disabled or when the first code and the second code have the same logic value, as illustrated in FIG. 19A, the signal driver 1800 might not control the pulse width of the output pulse signal ODTEN<j> regardless of a logic level of the input pulse signal ODT<j>. The first driver 1810 may generate the first driving pulse signal DPS1 after a first time T1 by inverting and driving the input pulse signal ODT<j>. The second driver 1820 may generate the first driving pulse signal DPS1 after the first time T1 by inverting and driving the first driving pulse signal DPS1. Enabling timing and disabling timing of the output pulse signal ODTEN<j> might not be controlled.

Figure 19B:
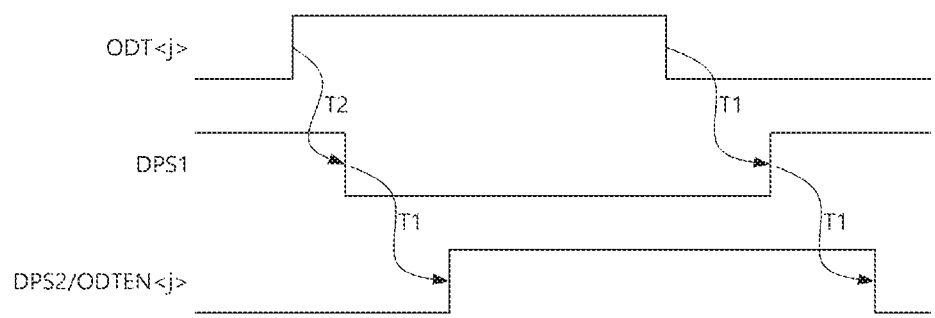

In the state in which the on-timing enable signal TON has been enabled and the off-timing enable signal TOFF has been disabled, when the input pulse signal ODT<j> has a high level pulse, the second on-timing control signal ONC2 may be enabled, and the first on-timing control signal ONC1, the first off-timing control signal OFC1, and the second off-timing control signal OFC2 may maintain a disabled state. As illustrated in FIG. 19B, when the input pulse signal ODT<j> shifts from a logic low level to a logic high level, the first driver 1810 may pull-down drive the first driving pulse signal DPS1, and the first pull-down driver 1832 may additionally pull-down drive the first driving pulse signal DPS1. Accordingly, the first driving pulse signal DPS1 may be enabled after a second time T2 shorter than the first time T1. The on-timing control circuit 1830 may advance the enabling timing of the first driving pulse signal DPS1, and may advance the phase of a falling edge of the first driving pulse signal DPS1 by increasing the slope of the falling edge. When the input pulse signal ODT<j> shifts from a logic high level to a logic low level, the first pull-down driver 1832 might not pull-down drive the first driving pulse signal DPS1. Accordingly, the first driving pulse signal DPS1 may be disabled after the first time T1, and the disabling timing of the first driving pulse signal DPS1 might not be controlled. The second driver 1820 may generate the second driving pulse signal DPS2 after the first time T1 by inverting and driving the first driving pulse signal DPS1. Accordingly, the signal driver 1800 may extend the pulse width of the output pulse signal ODTEN<j> by advancing only the enabling timing of the output pulse signal ODTEN<j>.

Figure 19C:
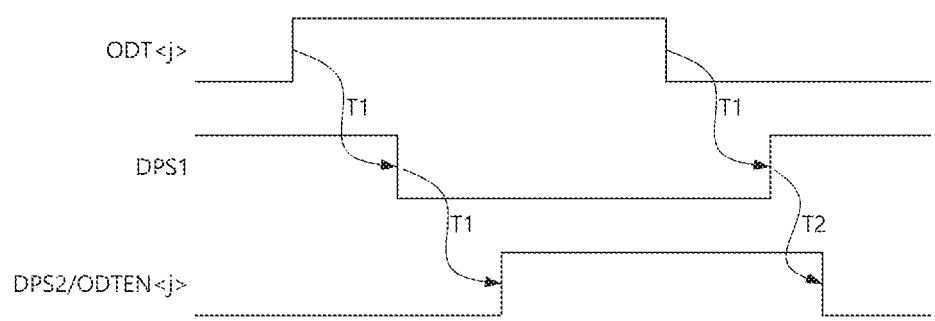

In the state in which the on-timing enable signal TON has been disabled, when the off-timing enable signal TOFF is enabled and the input pulse signal ODT<j> has a high level pulse, the second off-timing control signal OFC2 may be enabled, and the first on-timing control signal ONC1, the second on-timing control signal ONC2, and the first off-timing control signal OFC1 may maintain a disabled state. As illustrated in FIG. 19C, the first driver 1810 may generate the first driving pulse signal DPS1 after the first time T1 by inverting and driving the input pulse signal ODT<j>. When the first driving pulse signal DPS1 shifts from a logic high level to a logic low level, the second driver 1820 may pull-down drive the second driving pulse signal DPS2, and the second pull-down driver 1842 might not pull-down drive the second driving pulse signal DPS2. Accordingly, the second driving pulse signal DPS2 may be enabled after the first time T1, and enabling timing of the second driving pulse signal DPS2 might not be controlled. When the first driving pulse signal DPS1 shifts from a logic low level to a logic high level, the second driver 1820 may pull-down drive the second driving pulse signal DPS2, and the second pull-down driver 1842 may additionally pull-down drive the second driving pulse signal DPS2. Accordingly, the second driving pulse signal DPS2 may be disabled after the second time T2 shorter than the first time T1. The off-timing control circuit 1840 may advance the disabling timing of the second driving pulse signal DPS2, and may advance the phase of a falling edge of the second driving pulse signal DPS2 by increasing the slope of the falling edge. Accordingly, the signal driver 1800 can decrease the pulse width of the output pulse signal ODTEN<j> by advancing only the disabling timing of the output pulse signal ODTEN<j>.

Figure 19D:
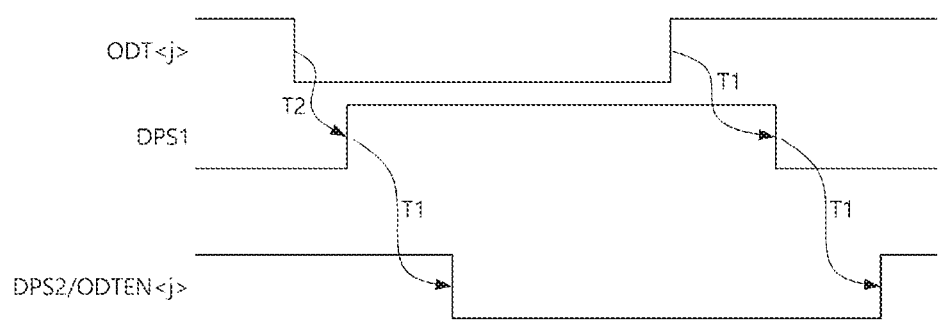

In the state in which the on-timing enable signal TON has been enabled and the off-timing enable signal TOFF has been disabled, when the input pulse signal ODT<j> has a low level pulse, the first on-timing control signal ONC1 may be enabled, and the second on-timing control signal ONC2, the first off-timing control signal OFC1, and the second off-timing control signal OFC2 may maintain a disabled state. As illustrated in FIG. 19D, when the input pulse signal ODT<j> shifts from a logic high level to a logic low level, the first driver 1810 may pull-up drive the first driving pulse signal DPS1, and the first pull-up driver 1841 may additionally pull-up drive the first driving pulse signal DPS1. Accordingly, the first driving pulse signal DPS1 may be enabled after the second time T2 shorter than the first time T1. The on-timing control circuit 1840 may advance enabling timing of the first driving pulse signal DPS1, and may advance the phase of a rising edge of the first driving pulse signal DPS1 by increasing the slope of the rising edge. When the input pulse signal ODT<j> shifts from a logic low level to a logic high level, the first pull-up driver 1841 might not pull-up drive the first driving pulse signal DPS1. Accordingly, the first driving pulse signal DPS1 may be disabled after the first time T1, and disabling timing of the first driving pulse signal DPS1 might not be controlled. The second driver 1820 may generate the second driving pulse signal DPS2 after the first time T1 by inverting and driving the first driving pulse signal DPS1. Accordingly, the signal driver 1800 may extend the pulse width of the output pulse signal ODTEN<j> by advancing only enabling timing of the output pulse signal ODTEN<j>.

Figure 19E:
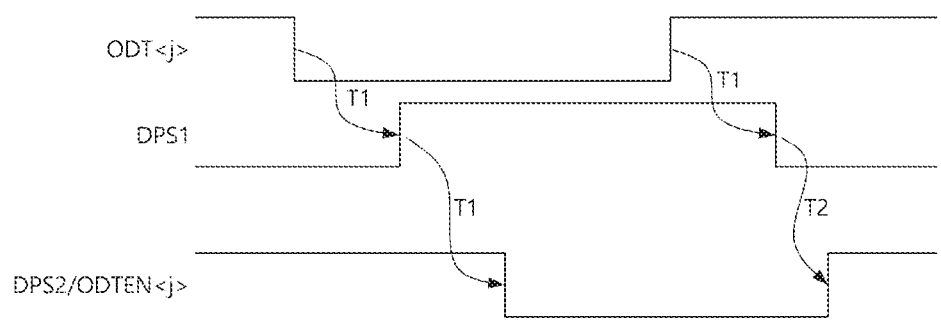

In the state in which the on-timing enable signal TON has been disabled, when the off-timing enable signal TOFF is enabled and the input pulse signal ODT<j> has a low level pulse, the first off-timing control signal OFC1 may be enabled, and the first on-timing control signal ONC1, the second on-timing control signal ONC2, and the second off-timing control signal OFC2 may maintain a disabled state. As illustrated in FIG. 19E, the first driver 1810 may generate the first driving pulse signal DPS1 after the first time T1 by inverting and driving the input pulse signal ODT<j>. When the first driving pulse signal DPS1 shifts from a logic low level to a logic high level, the second driver 1810 may pull-down drive the second driving pulse signal DPS2, and the second pull-up driver 1842 might not pull-up drive the second driving pulse signal DPS2. Accordingly, the second driving pulse signal DPS2 may be enabled after the first time T1, and enabling timing of the second driving pulse signal DPS2 might not be controlled. When the first driving pulse signal DPS1 shifts from a logic high level to a logic low level, the second driver 1820 may pull-up drive the second driving pulse signal DPS2, and the second pull-up driver 1842 may additionally pull-up drive the second driving pulse signal DPS2. Accordingly, the second driving pulse signal DPS2 may be disabled after the second time T2 shorter than the first time T1. The off-timing control circuit 1840 may advance disabling timing of the second driving pulse signal DPS2, and may advance the phase of a rising edge of the second driving pulse signal DPS2 by increasing the slope of the rising edge. Accordingly, the signal driver 1800 can decrease the pulse width of the output pulse signal ODTEN<j> by advancing only disabling timing of the output pulse signal ODTEN<j>.

While various embodiments have been described above, it will be understood to those skilled in the art that the embodiments described are by way of example only. Accordingly, the apparatus and method described herein should not be limited based on the described embodiments.

What is claimed is:

1. A signal driver comprising:
   a first driver configured to generate a first driving pulse signal by inverting and driving an input pulse signal;
   a second driver configured to generate a second driving pulse signal by inverting and driving the first driving pulse signal;
   an on-timing control circuit configured to pull-up drive or pull-down drive the first driving pulse signal based on a first on-timing control signal, a second on-timing control signal, and the input pulse signal; and
   an off-timing control circuit configured to pull-up drive or pull-down drive the second driving pulse signal based on a first off-timing control signal, a second off-timing control signal, and the first driving pulse signal.

2. The signal driver according to claim 1, wherein the on-timing control circuit is configured to:
   pull-up drive the first driving pulse signal by enabling the first on-timing control signal when the input pulse signal is a logic low pulse signal and an on-timing enable signal is enabled; and
   pull-down drive the first driving pulse signal by enabling the second on-timing control signal when the input pulse signal is a logic high pulse signal and the on-timing enable signal is enabled.

3. The signal driver according to claim 1, wherein the on-timing control circuit comprises:
   a first pull-up driver configured to pull-up drive the first driving pulse signal based on the first on-timing control signal and the input pulse signal; and
   a first pull-down driver configured to pull-down drive the first driving pulse signal based on the second on-timing control signal and the input pulse signal.

4. The signal driver according to claim 3, wherein the on-timing control circuit further comprises:
   a first on-timing control signal generator configured to enable the first on-timing control signal when the input pulse signal is a logic high pulse signal and the on-timing enable signal is enabled; and
   a second on-timing control signal generator configured to enable the second on-timing control signal when the input pulse signal is a logic low pulse signal and the on-timing enable signal is enabled.

5. The signal driver according to claim 1, wherein the off-timing control circuit is configured to:
   pull-up drive the second driving pulse signal by enabling the first off-timing control signal when the input pulse signal is a logic low pulse signal and an off-timing enable signal is enabled; and
   pull-down drive the second driving pulse signal by enabling the second off-timing control signal when the input pulse signal is a logic high pulse signal and the off-timing enable signal is enabled.

6. The signal driver according to claim 1, wherein the off-timing control circuit comprises:

a second pull-up driver configured to pull-up drive the second driving pulse signal based on the first off-timing control signal and the first driving pulse signal; and
a second pull-down driver configured to pull-down drive the second driving pulse signal based on the second off-timing control signal and the first driving pulse signal.

7. The signal driver according to claim 6, wherein the off-timing control circuit further comprises:
   a first off-timing control signal generator configured to enable the first off-timing control signal when the input pulse signal is a logic low pulse signal and the off-timing enable signal is enabled; and
   a second off-timing control signal generator configured to enable the second off-timing control signal when the input pulse signal is a logic high pulse signal and the off-timing enable signal is enabled.

8. A signal driver comprising:
   a first driver configured to generate a first driving pulse signal by inverting and driving an input pulse signal;
   a second driver configured to generate a second driving pulse signal by inverting and driving the first driving pulse signal;
   an on-timing control circuit configured to pull-up drive or pull-down drive the first driving pulse signal based on a logic level of the input pulse signal when an on-timing enable signal is enabled; and
   an off-timing control circuit configured to pull-up drive or pull-down drive the second driving pulse signal based on the logic level of the input pulse signal and the first driving pulse signal when an off-timing enable signal is enabled.

9. The signal driver according to claim 8, wherein the on-timing control circuit is configured to:
   control a phase or slope of a falling edge of the first driving pulse signal when the input pulse signal is a logic high pulse signal; and
   control a phase or slope of a rising edge of the first driving pulse signal when the input pulse signal is a logic low pulse signal.

10. The signal driver according to claim 8, wherein the off-timing control circuit is configured to:
    control a phase or slope of a falling edge of the second driving pulse signal when the input pulse signal is a logic high pulse signal; and
    control a phase or slope of a rising edge of the second driving pulse signal when the input pulse signal is a logic low pulse signal.

11. A signal driver comprising:
    a first driver configured to generate a first driving pulse signal by inverting and driving an input pulse signal;
    a second driver configured to generate a second driving pulse signal by inverting and driving the first driving pulse signal;
    an on-timing control circuit configured to control enabling timing of the first driving pulse signal based on a logic value of a first resistance code, a logic value of a second resistance code, an on timing enable signal, and the input pulse signal; and
    an off-timing control circuit configured to control disabling timing of the second driving pulse signal based on a logic value of the first resistance code, a logic value of the second resistance code, an off-timing enable signal, and the first driving pulse signal.

12. The signal driver according to claim 11, wherein the on-timing control circuit is configured to advance the enabling timing of the first driving pulse signal based on the input pulse signal, when the logic value of the first resistance code is different from the logic value of the second resistance code and the on-timing enable signal is enabled.

13. The signal driver according to claim 11, wherein the on-timing control circuit comprises:
- a first on-timing control signal generator configured to generate a first on-timing control signal based on the logic value of the first resistance code, the logic value of the second resistance code, and the on-timing enable signal;
- a first pull-up driver configured to pull-up drive the first driving pulse signal based on the first on-timing control signal and the input pulse signal;
- a second on-timing control signal generator configured to generate a second on-timing control signal based on the logic value of the first resistance code, the logic value of the second resistance code, and the on-timing enable signal; and
- a first pull-down driver configured to pull-down drive the first driving pulse signal based on the second on-timing control signal and the input pulse signal.

14. The signal driver according to claim 11, wherein the off-timing control circuit is configured to advance the disabling timing of the second driving pulse signal based on the first driving pulse signal when the logic value of the first resistance code is different from the logic value of the second resistance code and the off-timing enable signal is enabled.

15. The signal driver according to claim 11, wherein the off-timing control circuit comprises:
- a first on-timing control signal generator configured to generate a first off-timing control signal based on the logic value of the first resistance code, the logic value of the second resistance code, and the off-timing enable signal;
- a second pull-up driver configured to pull-up drive the second driving pulse signal based on the first off-timing control signal and the first driving pulse signal;
- a second off-timing control signal generator configured to generate a second off-timing control signal based on the logic value of the first resistance code, the logic value of the second resistance code, and the off-timing enable signal; and
- a second pull-down driver configured to pull-down drive the second driving pulse signal based on the second off-timing control signal and the first driving pulse signal.

* * * * *